(12) United States Patent
Osada et al.

(10) Patent No.: US 11,205,912 B2
(45) Date of Patent: Dec. 21, 2021

(54) POWER STORAGE SYSTEM, ELECTRONIC DEVICE, VEHICLE, AND ESTIMATION METHOD

(71) Applicant: SEMICONDUCTOR ENERGY LABORATORY CO., LTD., Atsugi (JP)

(72) Inventors: Takeshi Osada, Kanagawa (JP); Akihiro Chida, Kanagawa (JP); Toshiyuki Isa, Kanagawa (JP); Kazutaka Kuriki, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 31 days.

(21) Appl. No.: 16/627,429

(22) PCT Filed: Jul. 13, 2018

(86) PCT No.: PCT/IB2018/055177
§ 371 (c)(1),
(2) Date: Dec. 30, 2019

(87) PCT Pub. No.: WO2019/021099
PCT Pub. Date: Jan. 31, 2019

(65) Prior Publication Data
US 2020/0153264 A1    May 14, 2020

(30) Foreign Application Priority Data

Jul. 25, 2017  (JP) .............................. JP2017-143852
Dec. 27, 2017  (JP) .............................. JP2017-250309

(51) Int. Cl.
*H02J 7/00* (2006.01)
*G01R 31/387* (2019.01)
(Continued)

(52) U.S. Cl.
CPC .......... *H02J 7/00712* (2020.01); *B60L 50/64* (2019.02); *B60L 58/10* (2019.02); *G01R 31/367* (2019.01);
(Continued)

(58) Field of Classification Search
CPC .... H02J 7/00712; H02J 7/0048; H02J 7/0049; H02J 7/0013; H02J 7/02; H02J 7/005;
(Continued)

(56) References Cited

U.S. PATENT DOCUMENTS

| 7,554,296 B2 | 6/2009 | Mizuno et al. |
| 8,487,630 B2 | 7/2013 | Mori |
| 8,586,246 B2 * | 11/2013 | Nakai ................... H01M 4/137 429/231.95 |

(Continued)

FOREIGN PATENT DOCUMENTS

| CN | 102043132 A | 5/2011 |
| EP | 1691209 A | 8/2006 |

(Continued)

*Primary Examiner* — M Baye Diao
(74) *Attorney, Agent, or Firm* — Nixon Peabody LLP; Jeffrey L. Costellia

(57) ABSTRACT

A power storage system having excellent characteristics is provided. A power storage system having high safety is provided. A power storage system with little degradation is provided. A storage battery having excellent characteristics is provided. A method of operating a power storage system including a storage battery, a first circuit having a function of measuring an impedance, and a neural network includes a first step of stopping charging or discharging of the storage battery, a second step of measuring an open circuit voltage of the storage battery, a third step of measuring an impedance of the storage battery, a fourth step of inputting the open circuit voltage and the impedance that are measured to the input layer, a fifth step of outputting a first signal from the output layer, a sixth step of changing a condition of (Continued)

charging or discharging of the storage battery in accordance with the first signal, and a seventh step of starting charging or discharging of the storage battery; the first signal corresponds to the estimated value of the discharge capacity of the storage battery.

5 Claims, 23 Drawing Sheets

(51) Int. Cl.
    *G01R 31/389*     (2019.01)
    *G01R 31/367*     (2019.01)
    *B60L 50/64*     (2019.01)
    *B60L 58/10*     (2019.01)
    *G06N 3/04*     (2006.01)

(52) U.S. Cl.
    CPC ......... *G01R 31/387* (2019.01); *G01R 31/389* (2019.01); *G06N 3/04* (2013.01); *H02J 7/0048* (2020.01)

(58) Field of Classification Search
    CPC ............... H02J 7/0031; G01R 31/387; G01R 31/389; G01R 31/367; B60L 50/64; B60L 58/10; B60L 2240/545; B60L 2240/547; B60L 2240/549; B60L 2250/16; B60L 2240/622; B60L 2260/52; B60L 2260/44; B60L 2260/50; B60L 58/12; B60L 58/14; B60L 58/15; B60L 58/16; G06N 3/04; G06N 3/0454; Y02E 60/10; Y02T 10/70; Y02T 90/16; Y02T 10/72; H01M 10/42; H01M 10/44
    USPC ............................................ 320/109; 702/63
    See application file for complete search history.

(56) References Cited

U.S. PATENT DOCUMENTS

| 9,026,347 | B2* | 5/2015 | Gadh ................ B60L 53/51 |
| | | | 701/123 |
| 9,099,889 | B2* | 8/2015 | Sato ................ H02J 7/1446 |
| 10,141,069 | B2 | 11/2018 | Ikeda et al. |
| 10,164,448 | B2 | 12/2018 | Tanaka et al. |
| 10,644,359 | B2* | 5/2020 | Fujita ................ H02J 7/0021 |
| 10,663,523 | B2* | 5/2020 | Fukui ................ G01R 31/389 |
| 10,879,708 | B2* | 12/2020 | Belkacem-Boussaid .......... |
| | | | H02J 7/34 |
| 2006/0181245 | A1 | 8/2006 | Mizuno et al. |
| 2008/0234956 | A1* | 9/2008 | Mizuno ............. G01R 31/367 |
| | | | 702/63 |
| 2011/0084702 | A1 | 4/2011 | Mori |
| 2013/0013235 | A1* | 1/2013 | Takahashi ......... G01R 31/367 |
| | | | 702/63 |
| 2013/0015860 | A1* | 1/2013 | Crombez ............ H01M 10/44 |
| | | | 324/433 |
| 2013/0096858 | A1 | 4/2013 | Amano et al. |
| 2016/0343452 | A1 | 11/2016 | Ikeda et al. |
| 2017/0366023 | A1 | 12/2017 | Tanaka et al. |
| 2018/0026454 | A1* | 1/2018 | Belkacem-Boussaid .......... |
| | | | G01R 31/389 |
| | | | 702/63 |
| 2019/0164620 | A1 | 5/2019 | Ikeda et al. |

FOREIGN PATENT DOCUMENTS

| FR | 3029315 A1 * | 6/2016 | .......... G01R 31/389 |
| JP | 2003-249271 A | 9/2003 | |
| JP | 2006-220616 A | 8/2006 | |
| JP | 2011-103291 A | 5/2011 | |
| JP | 2011-109840 A | 6/2011 | |
| JP | 2013-089424 A | 5/2013 | |
| JP | 2016-219011 A | 12/2016 | |
| KR | 2006-0091269 A | 8/2006 | |
| WO | WO-2016/132586 | 8/2016 | |
| WO | WO-2018/203170 | 11/2018 | |
| WO | WO-2018/229597 | 12/2018 | |

* cited by examiner

POWER STORAGE SYSTEM, ELECTRONIC DEVICE, VEHICLE, AND ESTIMATION METHOD

TECHNICAL FIELD

One embodiment of the present invention relates to a storage battery and a power storage system using the storage battery. One embodiment of the present invention relates to a vehicle using a storage battery. One embodiment of the present invention relates to an electronic device using a storage battery.

One embodiment of the present invention relates to a semiconductor device.

One embodiment of the present invention relates to a neural network and a power storage system using the neural network. One embodiment of the present invention relates to a vehicle using a neural network. One embodiment of the present invention relates to an electronic device using a neural network.

In this specification and the like, a semiconductor device generally means a device that can function by utilizing semiconductor characteristics. A display device, a light-emitting device, a memory device, an electro-optical device, a power storage device, a semiconductor circuit, and an electronic device include a semiconductor device in some cases.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

Storage batteries are mounted on various movable apparatuses such as electronic devices such as information terminals and vehicles. The variety of operational conditions of these apparatuses leads to a variety of storage battery loads. Improvements in storage battery performance, such as higher energy density and a longer lifetime, have increasingly been demanded.

Patent Document 1 shows an example where a neural network is used for calculation of the remaining capacity of a storage battery.

In recent years, transistors using oxide semiconductors or metal oxides in their channel formation regions (Oxide Semiconductor transistors, hereinafter referred to as OS transistors) have attracted attention. The off-state current of an OS transistor is extremely low. Applications that employ OS transistors to utilize their extremely low off-state currents have been proposed. For example, Patent Document 2 discloses an example in which an OS transistor is used for learning in a neural network.

PRIOR ART DOCUMENTS

Patent Documents

[Patent Document 1] United States Patent Application Publication No. 2006/0181245

[Patent Document 2] Japanese Published Patent Application No. 2016-219011

SUMMARY OF THE INVENTION

Problems to be Solved by the Invention

An object of one embodiment of the present invention is to provide a power storage system having excellent characteristics. Another object of one embodiment of the present invention is to provide a power storage system having high safety. Another object of one embodiment of the present invention is to provide a power storage system with little degradation.

Another object of one embodiment of the present invention is to determine the state of a storage battery. Another object of one embodiment of the present invention is to estimate the performance of a storage battery. Another object of one embodiment of the present invention is to provide a storage battery having excellent characteristics. Another object of one embodiment of the present invention is to provide a storage battery having high safety. Another object of one embodiment of the present invention is to provide a storage battery with little degradation. Another object of one embodiment of the present invention is to provide an electronic device including a power storage system having excellent characteristics. Another object of one embodiment of the present invention is to provide a vehicle including a power storage system having excellent characteristics. Another object of one embodiment of the present invention is to provide a novel semiconductor device.

Description of more than one objects does not preclude the existence of each other. Note that one embodiment of the present invention need not necessarily achieve all of these objects. Objects other than those listed above become apparent from the description of the specification, the drawings, the claims, and the like, and such objects could be objects of one embodiment of the present invention.

Means for Solving the Problem

One embodiment of the present invention is a method of operating a power storage system, including a storage battery, a first circuit, and a neural network, in which the first circuit has a function of measuring an impedance and the neural network includes an input layer, an output layer, and one or more hidden layers between the input layer and the output layer, and which includes a first step of stopping charging or discharging of the storage battery, a second step of measuring an open circuit voltage of the storage battery, a third step of measuring an impedance of the storage battery, a fourth step of inputting the open circuit voltage and the impedance that are measured to the input layer, a fifth step of outputting a first signal from the output layer, a sixth step of changing a condition of charging or discharging of the storage battery in accordance with the first signal, and a seventh step of starting charging or discharging of the storage battery. The first signal corresponds to the estimated value of the discharge capacity of the storage battery.

Another embodiment of the present invention is a method of operating a power storage system, including a storage battery, a first circuit, and a neural network, in which the first circuit has a function of measuring an impedance and the neural network includes an input layer, an output layer, and one or more hidden layers between the input layer and the output layer, and which includes a first step of measuring a full charge capacity of the storage battery, a second step of charging the storage battery, a third step of discharging the storage battery, a fourth step of alternately repeating the second step and the third step, and a fifth step of measuring the full charge capacity of the storage battery. The second step has a structure in which charging is stopped midway through a charging process and a remaining capacity, an open circuit voltage, and an impedance are calculated. The storage battery capacity measured in the first step is C1. The storage battery capacity measured in the fifth step is C2. The remaining capacity, the open circuit voltage, and the impedance that are measured in the second step are input to the neural network. A second signal is output from the neural network when C2/C1 is greater than or equal to a first value and a third signal is output from the neural network when the C2/C1 is less than the first value.

In the above operation method, the C2/C1 is greater than or equal to 0.7 and less than or equal to 0.95, for example.

In the above operation method, for example, the neural network includes a first transistor, a capacitor, and a second transistor. One of a source and a drain of the first transistor is electrically connected to one electrode of the capacitor and a gate of the second transistor. A channel formation region of the first transistor includes a metal oxide. The metal oxide includes indium and an element M. The element M is one or more selected from aluminum, gallium, tin, boron, silicon, titanium, iron, nickel, germanium, yttrium, zirconium, molybdenum, lanthanum, cerium, neodymium, hafnium, tantalum, and tungsten. A potential corresponding to analog data is retained in one of the source and the drain of the first transistor. In the above structure, a channel region of the second transistor includes silicon, for example.

Another embodiment of the present invention is a vehicle including the power storage system operated by the operation method described in any of the above. Another embodiment of the present invention is an electronic device including the power storage system operated by the operation method described in any of the above.

Another embodiment of the present invention is an estimation method in which processing of estimating a capacity available for discharging of a storage battery at a predetermined output using a neural network is executed by a computer on the basis of an external temperature and an impedance of the storage battery.

In the above estimation method, the upper limit value A of a discharging output of the storage battery is preferably set.

Another embodiment of the present invention is an electronic device that includes a control circuit, a display portion, and a storage battery. The control circuit includes a neural network. The control circuit executes processing of estimating a capacity available for discharging of the storage battery at a predetermined output using the neural network on the basis of an external temperature and an impedance of the storage battery. The display portion has a function of displaying the capacity available for discharging.

Another embodiment of the present invention is a vehicle including a navigation system and a storage battery. The navigation system includes a neural network. Using the neural network, the navigation system executes processing of estimating a capacity available for discharging of the storage battery at a predetermined output on the basis of an external temperature and an impedance of the storage battery and executes processing of estimating a possible traveling distance on the basis of the capacity available for discharging. The navigation system estimates a distance to be travelled to a charging spot located on a route from the present location to the destination on the basis of destination information input to the navigation system. The upper limit value A of an output of the storage battery is set so that the possible traveling distance becomes longer than the distance to be travelled.

In the above structure, it is preferable that the navigation system include a display portion and that the display portion have a function of displaying the upper limit value A.

In the above structure, it is preferable that the navigation system include a display portion and have a function of displaying an alert on the display portion when the output of the storage battery reaches 90% or more of the upper limit value A.

In the above structure, the navigation system preferably estimates the maximum gradient of a road on the route from the present location to the destination on the basis of the destination information input to the navigation system, sets the maximum recommended output B of the storage battery on the basis of the maximum gradient, and has a function of displaying an alert on the display portion when the maximum recommended output B exceeds the upper limit value A.

Effect of the Invention

An object is to provide a power storage system having excellent characteristics according to one embodiment of the present invention. An object is to provide a power storage system having high safety according to one embodiment of the present invention. An object is to provide a power storage system with little degradation according to one embodiment of the present invention.

According to one embodiment of the present invention, the state of a storage battery can be determined. According to one embodiment of the present invention, the performance of a storage battery can be estimated. According to one embodiment of the present invention, a storage battery having excellent characteristics can be provided. According to one embodiment of the present invention, a storage battery having high safety can be provided. According to one embodiment of the present invention, a storage battery with little degradation can be provided. According to one embodiment of the present invention, an electronic device including a power storage system having excellent characteristics can be provided. According to one embodiment of the present invention, a vehicle including a power storage system having excellent characteristics can be provided. According to one embodiment of the present invention, a novel semiconductor device can be provided.

The descriptions of the effects do not preclude the existence of other effects. Note that one embodiment of the present invention does not have to have all of these effects. Other effects will be apparent from and can be derived from the description of the specification, the drawings, the claims, and the like.

MODE FOR CARRYING OUT THE INVENTION

Figure 1A:
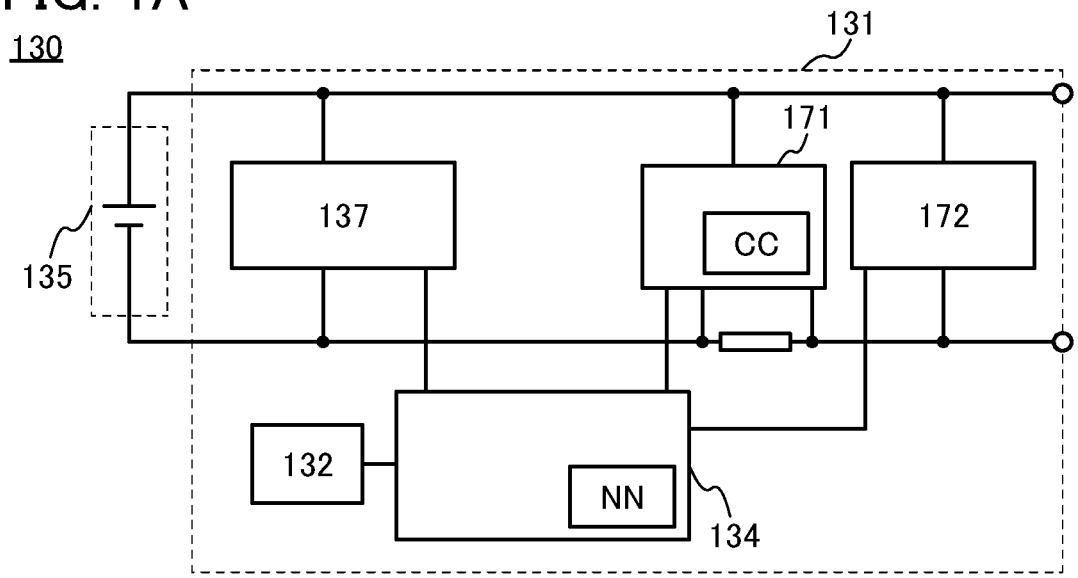
FIG. 1 Examples of a power storage system.

Hereinafter, embodiments will be described with reference to drawings. Note that the embodiments can be implemented with many different modes, and it will be readily appreciated by those skilled in the art that modes and the details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings schematically show ideal examples, and shapes, values or the like are not limited to shapes, values or the like shown in the drawings.

In this specification, the embodiments described below can be combined as appropriate. In the case where a plurality of structure examples are described in one embodiment, the structure examples can be combined with each other as appropriate.

In this specification, a neural network refers to a general model that is modeled on a biological neural network, determines the weight coefficient (also referred to as a connection strength) of neurons by learning, and has the capability of solving problems. A neural network includes an input layer, a hidden layer (also referred to as an intermediate layer), and an output layer.

In describing a neural network in this specification, to determine a weight coefficient of neurons from existing information is sometimes referred to as learning.

Moreover, in this specification, to draw a new conclusion from a neural network formed using connection strengths obtained by learning is sometimes referred to as inference.

In this specification and the like, a transistor including an oxide semiconductor or a metal oxide in its channel formation region is referred to as an oxide semiconductor transistor or an OS transistor.

Embodiment 1

In this embodiment, a structure example and an operation example of a power storage system of one embodiment of the present invention are described.

The power storage system of one embodiment of the present invention includes a storage battery and a control system that controls the storage battery. The control system includes a neural network.

Storage batteries vary in properties in some cases. For example, in some cases, storage batteries are degraded because of repeated charging and discharging, and the amount of degradation varies depending on storage batteries. For easy understanding, an increase in impedance is considered as an example of the degradation of storage batteries.

The power storage system of one embodiment of the present invention includes a neural network. Data is given to the neural network in advance, and learning is performed. Here, data with the passage of time, such as a parameter of a storage battery involved with charge and discharge cycles, is learned, whereby a variation in parameter with the passage of time can be estimated. For example, learning is performed and then a parameter of a storage battery is input to the neural network, which can provide an output of the estimated value of an impedance increase after the passage of a certain time, e.g., after charge and discharge cycles repeated a certain number of times.

The power storage system of one embodiment of the present invention is capable of estimating, in advance, an impedance increase following repeated charging and discharging. For example, impedance increases in a plurality of storage batteries are estimated in advance, and storage batteries in which the increase is significantly small are selected and mounted in an apparatus, so that the lifetime of the storage batteries in the apparatus can be extended.

The neural network learns the data with the passage of time in advance. When the neural network is used in inference about a storage battery, a variation in parameter of the storage battery over time at the subsequent time can be estimated not by input of complicated data with the passage of time, but only by supply of data at a certain time or data at and near a certain time to the neural network.

When there are a plurality of storage batteries, the storage batteries are grouped by the obtained estimated value of an impedance increase, and storage batteries belonging to the same group are incorporated in the same apparatus. Consequently, the lifetime of the storage batteries in the apparatus can be extended.

Charging conditions may be varied depending on the estimated value of an impedance increase. If the upper limit of a charging voltage is increased, energy density can be increased but the impedance is more likely to increase in some cases. The upper limit of a charging voltage may be increased to increase energy density in a storage battery, for example, in which the estimated value of the impedance increase is small.

If the charging current and the charging voltage of a storage battery are reduced, a reduction in the discharge capacity of the storage battery can be inhibited. Accordingly, the lifetime of the storage battery can be further extended.

The power storage system of one embodiment of the present invention includes a storage battery and a control circuit that controls the storage battery.

In the power storage system of one embodiment of the present invention, the state of the storage battery is determined. In the power storage system of one embodiment of the present invention, the capacity of the storage battery is measured or estimated.

The power storage system of one embodiment of the present invention includes a neural network. Preferably, the state of the storage battery included in the power storage system is determined by the neural network. Preferably, a parameter of the storage battery is input and the state of the storage battery is output to the neural network.

Parameters of the storage battery, such as a current, a voltage, and an impedance, are measured by the power storage system of one embodiment of the present invention. An open circuit voltage (OCV) of the storage battery is measured by the power storage system of one embodiment of the present invention.

The OCV is obtained by measurement of the voltage after charging or discharging is stopped, a predetermined time passes, and then battery reaction is stabilized, for example. It may take a long time to measure the OCV because a standby state is held with charging or discharging stopped for a predetermined time until battery reaction is stabilized. Here, the predetermined time is, for example, longer than or equal to 2 minutes and shorter than or equal to 5 hours, or longer than or equal to 5 minutes and shorter than or equal to 2 hours.

Since measuring the OCV may take a long time, for example, measurement in which the time (hereinafter, referred to as a pause time) when a standby state is held with charging or discharging stopped is further reduced may be performed as an alternative measurement. In this case, the relation between the pause time and the measured voltage of the storage battery may be learned in advance by the neural network of one embodiment of the present invention. The learning allows the OCV to be estimated from the voltage with a short pause time, in some cases.

In an alternative measurement of the OCV, for example, the OCV may be estimated by measurement of a variation in voltage while the current value of charging or discharging is varied.

In the power storage system of one embodiment of the present invention, the SOC (State of Charge) of the storage battery is measured or estimated in some cases. SOC here is, for example, a value representing the percentage of the storage battery capacity, where the full charge capacity (FCC) is 100%. SOC is referred to as a charging rate in some cases, FCC is, for example, the discharge capacity of a storage battery in the case where discharging is performed after full charging is performed. Full charging refers to, for example, charging a storage battery to the end under predetermined charging conditions, FCC is a value that varies depending on an end-of-charge voltage (an upper charging voltage limit), an end-of-charge current, or the like. The product of FCC and SOC may be referred to as a remaining capacity (RC) of a storage battery.

By the neural network of one embodiment of the present invention, the state of the storage battery, for example, the FCC is preferably determined. Alternatively, a change in the FCC of the storage battery over time is preferably estimated.

In the power storage system of one embodiment of the present invention, for example, a parameter of a storage battery, such as an OCV, an SOC, an impedance, or an FCC, is supplied to the neural network included in the power storage system, so that learning can be performed. At this time, the parameter supplied to the neural network is preferably a parameter with the passage of time. For example, a variation in parameter which occurs with repeated charging and discharging of the storage battery is supplied to the neural network. Alternatively, for example, a variation in parameter between before and after preservation of the storage battery is supplied. The preservation of the storage battery includes the case where the storage battery is kept with a predetermined SOC at a predetermined temperature for a certain length of time.

The neural network included in the power storage system of one embodiment of the present invention enables the SOC to be estimated from the OCV of the storage battery in some cases.

The impedance of the storage battery varies depending on the SOC in some cases. The variation in SOC changes the state of oxidation-reduction of a positive electrode and a negative electrode, the state of overvoltage, the state of polarization, and the like in the storage battery, for example. Therefore, the variation in SOC also changes each impedance, for example. This also changes the impedance of the whole storage battery.

<Measurement Example of OCV>

Figure 12:
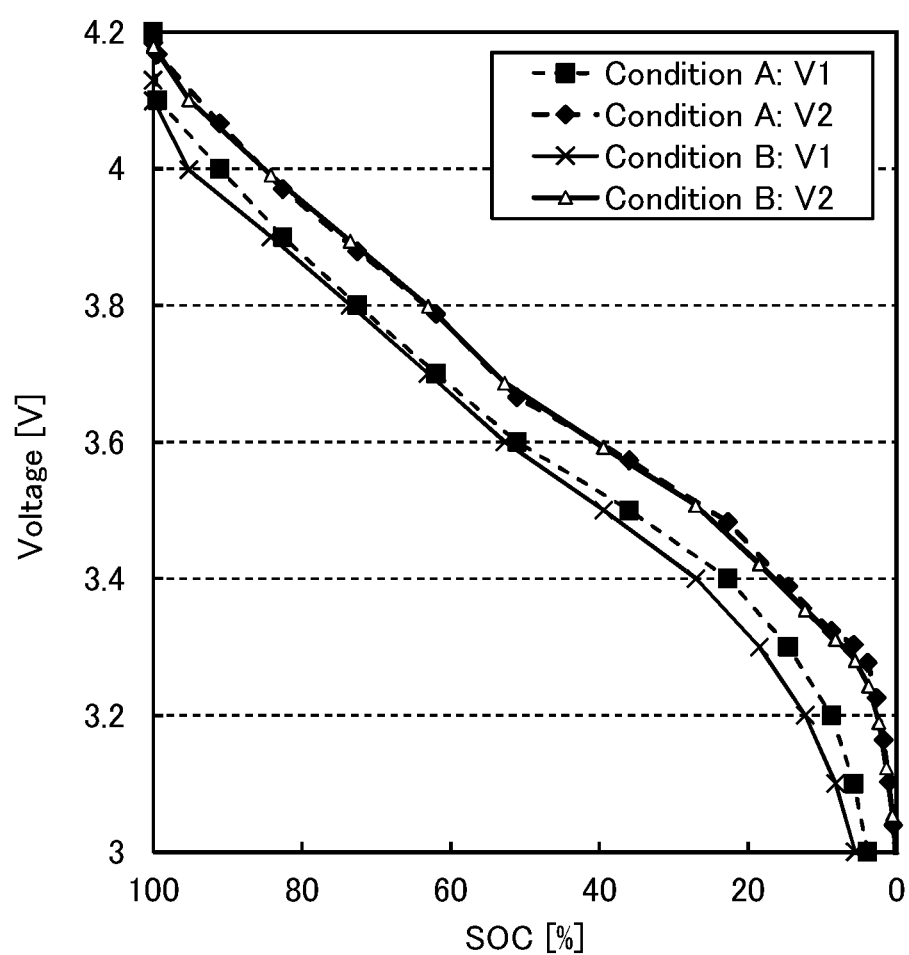
FIG. 12 A diagram showing a relation between SOC and OCV.

FIG. 12 shows measurement results of the relation between the SOC and the OCV of a lithium-ion battery.

In FIG. 12, the horizontal axis represents SOC and the vertical axis represents voltage. The lithium-ion battery is fully charged and then discharged at 0.2 C. A pause is taken at intervals of 0.1 V so that the voltage is measured. The voltage at the beginning of a pause is V1 and the voltage after a pause is V2. V2 was estimated as an OCV value. A pause time was 10 minutes.

The curve of Condition A shown in FIG. 12 shows the results of the measurements performed before a charge and discharge cycle test is performed. Condition B shows the results of the measurements performed after 200 charge and discharge cycles.

The difference in V2, i.e., OCV, between Condition A and Condition B was smaller than the difference in V1 even after the 200 charge and discharge cycles. It can be said that the variation in OCV depending on a charge and discharge cycle or the like which may cause degradation is small.

An impedance indicates the degradation state of a storage battery. For example, degradation of a storage battery occurs as a phenomenon of an impedance increase in some cases. The case where the degradation states of a plurality of storage batteries are compared by comparing their respective impedances is considered as an example. As described above, an impedance varies depending on the SOC of a storage battery.

Thus, when storage batteries differ in SOC, both the degradation states and the SOCs influence the impedances; thus, the influences of the factors need to be separated from each other.

With the use of the power storage system of one embodiment of the present invention, the influences of a degradation state and an SOC can be separated from each other. For example, the neural network included in the power storage system of one embodiment of the present invention uses an impedance at a given SOC to estimate an impedance at a different SOC.

The neural network is capable of analysis and a desired output depending on the intended use by receiving a huge number of parameters having a complicated correlation.

When degradation states of storage batteries are compared using their respective measured impedances, the use of the power storage system of one embodiment of the present invention allows the comparison between the storage batteries without making the SOCs substantially the same. Thus, the degradation states can be easily compared.

<Example of Power Storage System>

FIG. 1(A) illustrates a power storage system of one embodiment of the present invention. A power storage system 130 includes a storage battery 135 and a control system 131. The control system 131 includes a protective circuit 137, a circuit 171, a circuit 172, a control circuit 134, and a memory 132.

The protective circuit 137 has a function of stopping the operation of the storage battery 135 when the storage battery 135 satisfies a certain predetermined condition. For example, the operation is stopped when the current of the storage battery 135 exceeds a certain value. For example, the operation is stopped when the voltage of the storage battery 135 becomes higher than or equal to a certain value or lower than or equal to a certain value.

The protective circuit 137 preferably has a function of measuring the voltage and the current of the storage battery 135. Alternatively, the protective circuit 137 may control the storage battery 135 by using the current and the voltage of the storage battery 135 measured by the circuit 171 described later, for example.

When stopping the operation of the storage battery 135, the protective circuit 137 may have a route to connect a positive electrode and a negative electrode of the storage battery 135 to cause a short-circuit between the two electrodes. A resistor or a capacitor may be provided in the route.

The circuit 171 is electrically connected to the positive electrode and the negative electrode of the storage battery 135. The circuit 171 has a function of measuring the current and the voltage of the storage battery 135. The circuit 171 is electrically connected to the control circuit 134 and supplied with a signal from the control circuit 134.

The circuit 171 preferably includes a coulomb counter CC. The coulomb counter CC has a function of calculating the amount of accumulated charges by using time characteristics of the current of the storage battery 135. An ammeter included in the coulomb counter may also serve as an ammeter included in the circuit 171.

The circuit 172 is electrically connected to the positive electrode and the negative electrode of the storage battery 135. The circuit 172 has a function of measuring the impedance of the storage battery 135. The circuit 172 is electrically connected to the control circuit 134 and supplied with a signal from the control circuit 134.

The control circuit 134 includes a neural network NN. The control circuit 134 is electrically connected to the memory 132. Using the current and the voltage of the storage battery which are measured by the circuit 171 and the like, the control circuit 134 controls the current and the voltage of the storage battery and controls charging conditions and discharging conditions of the storage battery.

Figure 1B:
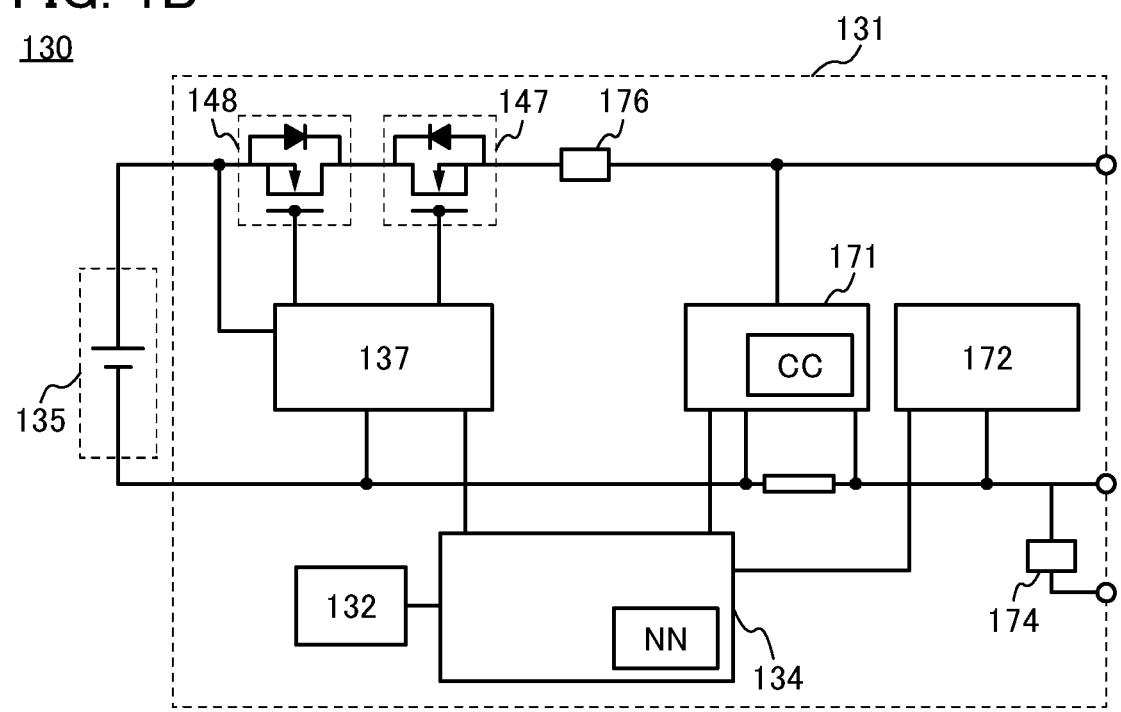

As illustrated in FIG. 1(B), the power storage system 130 may include a transistor 147 and a transistor 148. The transistor 147 and the transistor 148 function as switches that block current, and the switches are operated when the protective circuit 137 determines that the storage battery 135 is stopped. Although MOSFETs including parasitic diodes are illustrated as the transistor 147 and the transistor 148 in the example illustrated in FIG. 1(B), OS transistors may be used as the transistor 147 and the transistor 148. The details of an OS transistor are described later. The power storage system 130 may have a structure without the transistor 147 or the transistor 148.

As illustrated in FIG. 1(B), the power storage system 130 may include a fuse 176.

As illustrated in FIG. 1(B), the power storage system 130 may include a thermistor 174.

Figure 2A:
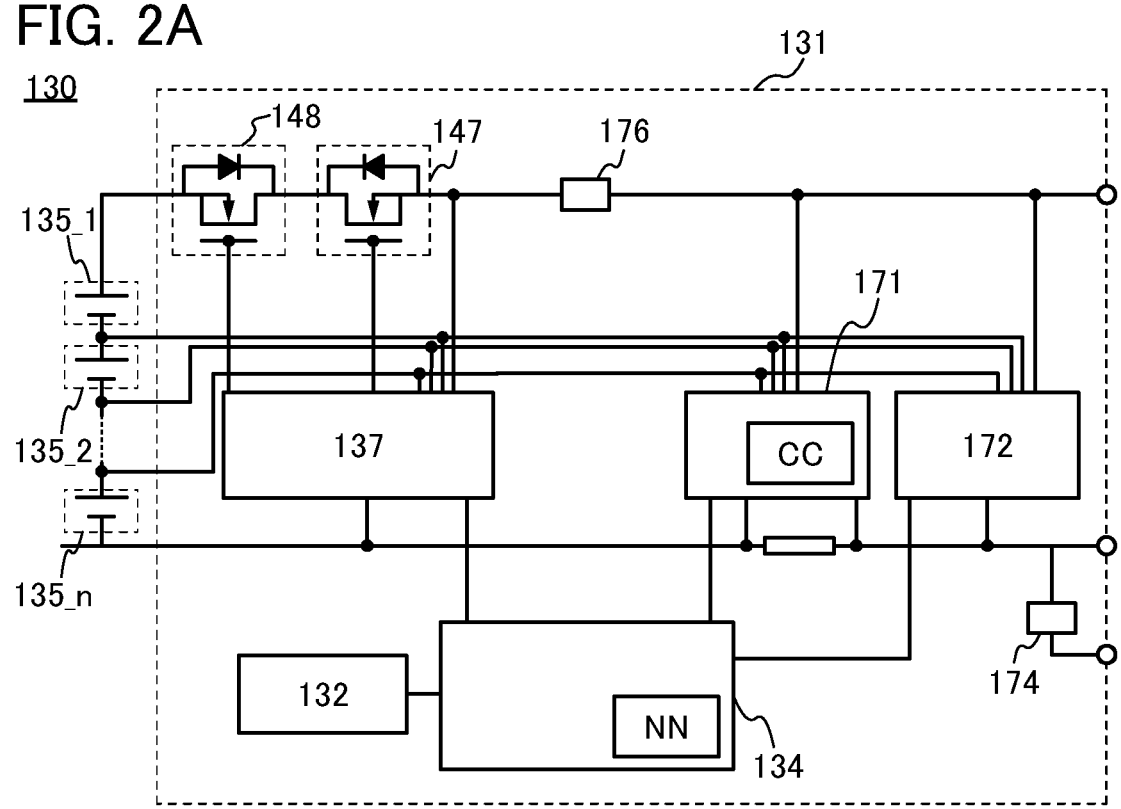
FIG. 2 Examples of a power storage system.

FIG. 2(A) illustrates an example of the power storage system 130 including n storage batteries 135, where n is an integer greater than or equal to 2. In FIG. 2(A), each of the plurality of storage batteries 135 is referred to as a storage battery $135\_k$ (k is an integer greater than or equal to 1 and less than or equal to n). The storage battery $135\_1$ to the storage battery $135\_n$ are electrically connected in series.

In FIG. 2(A), the protective circuit 137, the circuit 171, and the circuit 172 are each electrically connected to electrodes on both ends of each of the storage battery $135\_1$ to the storage battery $135\_p$.

Figure 2B:
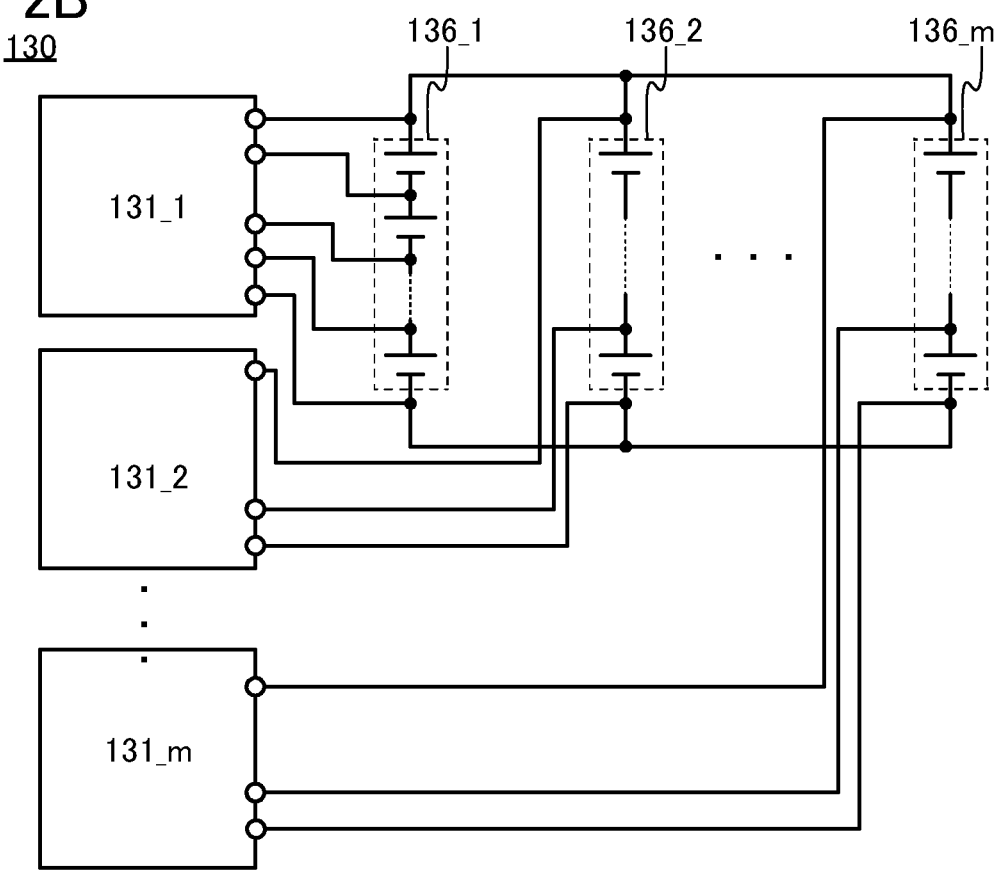

FIG. 2(B) illustrates an example in which the power storage system 130 includes m control systems 131, where m is an integer greater than or equal to 2. In FIG. 2(B), each of the plurality of control systems 131 is referred to as a control system $131\_j$ (j is an integer greater than or equal to 1 and less than or equal to m).

In FIG. 2(B), the power storage system 130 includes a plurality of battery groups 136. In FIG. 2(B), each of the plurality of battery groups 136 is referred to as a battery group $136\_1$. The battery group 136 includes a plurality of storage batteries electrically connected in series.

In FIG. 2(B), the plurality of battery groups 136 are electrically connected in parallel.

In FIG. 2(B), the control system 131 is connected to each of the battery groups 136. The control system $131j$ is electrically connected to the battery group $136\_j$.

When the plurality of control systems 131 are included in the power storage system 130, the plurality of control systems 131 may share the protective circuit 137, the circuit 171, the circuit 172, the control circuit 134, and the memory 132 included in the control system 131. For example, the control circuit 134 may supply a control signal to the plurality of control systems 131.

<Example of Inference>

Figure 3:
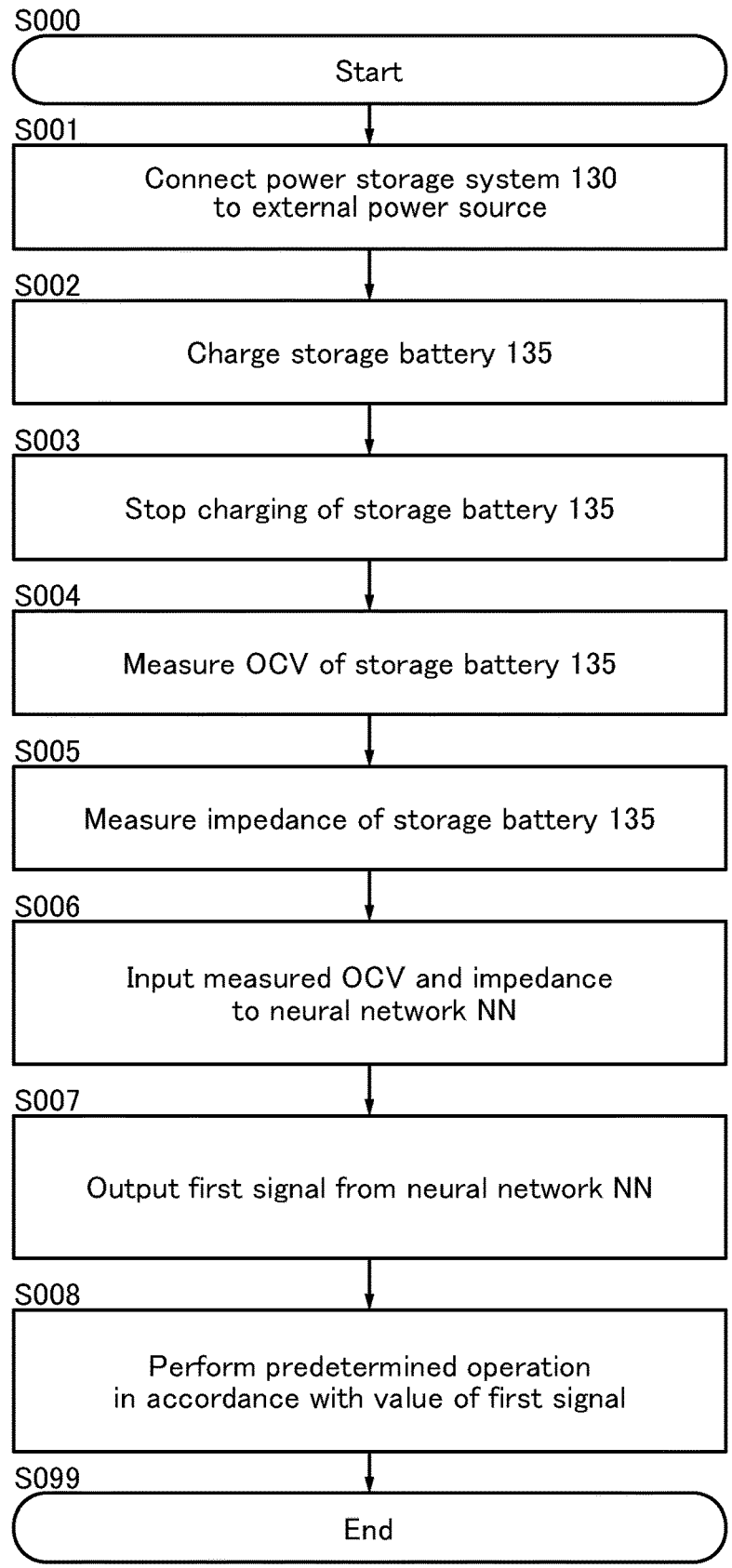
FIG. 3 A flow diagram showing an operation of a power storage system.

An example of operation of the power storage system 130 is described using a flow diagram illustrated in FIG. 3. FIG. 3 shows an example of the case in which parameters of the storage battery 135 included in the power storage system 130 are inferred when learning data is given in advance to the neural network NN included in the power storage system 130.

In Step S000, processing starts (START).

In Step S001, the power storage system 130 is connected to an external power source. Electric power is supplied from the external power source to the power storage system 130. The power storage system 130 is not necessarily connected to the external power source. In that case, electric power may be supplied from the storage battery 135 to the circuit included in the control system in the power storage system 130.

In Step S002, the storage battery 135 is charged. In Step S002, the storage battery 135 may be discharged, not charged.

In Step S003, the operation of the storage battery 135 is stopped. Charging is stopped in the case where charging is performed in Step S002, or discharging is stopped in the case where discharging is performed.

In Step S004, the OCV of the storage battery 135 is measured.

In Step S005, the impedance of the storage battery 135 is measured.

Figure 6A:
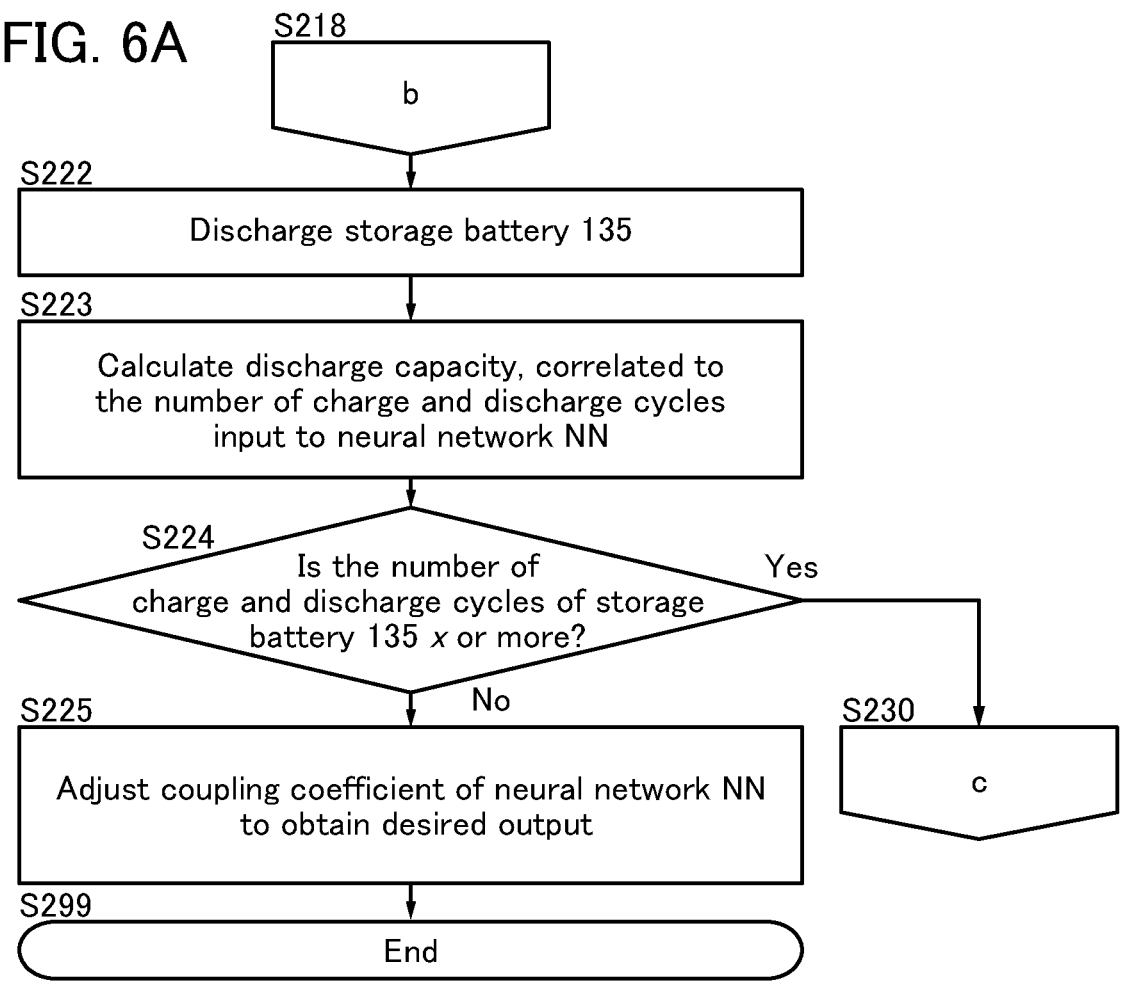
FIG. 6 A flow diagram and circuit diagrams showing an operation of a power storage system.
Figure 6B:
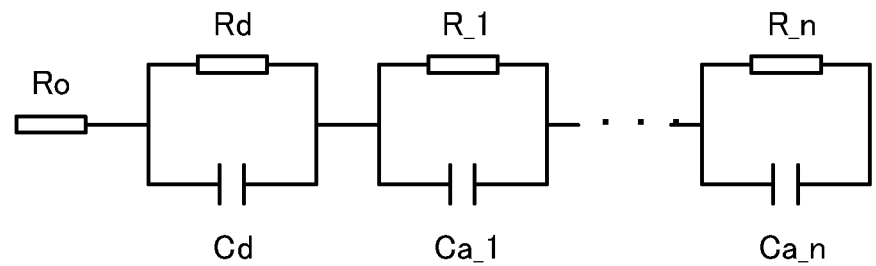

The impedance can be analyzed using an equivalent circuit shown in FIG. 6(B). In the equivalent circuit shown in FIG. 6(B), a resistor Ro, n resistors (an h-th resistor is denoted as a resistor $R\_h$, where h is an integer greater than or equal to 1 and less than or equal to n), and n capacitors (an h-th capacitor is denoted as a capacitor Ca_h) are included. The resistor R_h and the capacitor Ca_h are connected in parallel, and the resistor Ro and a resistor R_1 to a resistor R_n are connected to each other in series.

Measurement results of the impedance can be shown as a Nyquist plot, and analysis can be performed. The diameter of an arc seen in the Nyquist plot corresponds to each resistor shown in FIG. 6(B) in some cases. An example of the Nyquist plot is described later with reference to FIG. 13(C).

For example, parameters corresponding to phenomena such as diffusion of ions, charge transfer, transfer of electrons and ions, and contact resistance can be separated from each other and estimated from the resistance and the capacitance calculated from results of analysis using the equivalent circuit illustrated in FIG. 6(B) in some cases.

Figure 6C:
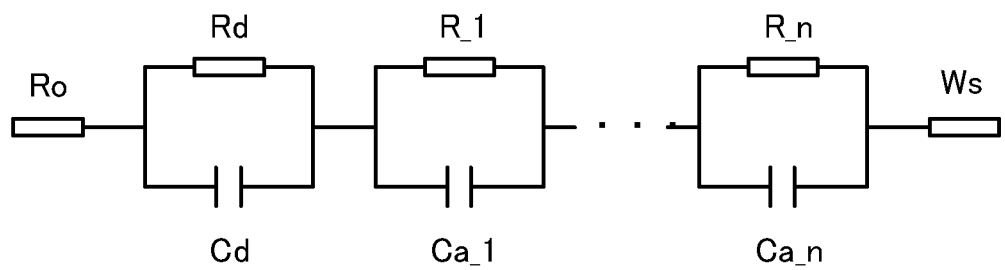

In FIG. 6(C), an equivalent circuit includes an impedance Ws. The impedance Ws is electrically connected to the resistor R_n in series. The impedance Ws is shown as a 45° straight line in the Nyquist plot and referred to as a Warburg impedance in some cases.

The impedance is measured in a certain frequency range. For example, the impedance is preferably measured at one frequency point, preferably two or more frequency points, further preferably 10 or more and 100 or less frequency points in the range of 10 Hz to 1 MHz inclusive, or 10 mHz to 50 kHz inclusive.

The power storage system of one embodiment of the present invention preferably includes an AC power source.

Measurement of a step response may be performed instead of impedance measurement. In the measurement of a step response, an AC power source is not needed, and evaluation can be performed with a simpler measurement system in some cases.

On the basis of a step function (e.g., a rectangular wave), a given voltage is applied to an element such as a storage battery for a given length of time, in which case the variation with time in current of the storage battery is measured in the period during which the given voltage is applied and after that, whereby response characteristics (step response) can be evaluated. This is not limited to a step function of a rectangular wave or the like, and a voltage may be applied to the storage battery using a triangle wave, a sawtooth wave, or the like.

A transfer function can be obtained using the waveform of the input voltage and the waveform of the output current. The transfer function can be represented as a function of a complex number s. By substitution of jai as the complex number s, AC frequency characteristics can be obtained.

In Step S006, the OCV measured in Step S004 and the impedance measured in Step S005 are input to the neural network NN.

In Step S007, a first signal is output from the neural network NN in accordance with the values input in Step S006. The first signal is, for example, the estimated value of an impedance increase, the estimated value of the discharge capacity decrease, or the like in the case where the operation of the storage battery further continues. Alternatively, the first signal is determination data based on changes in such parameters or estimated values of such parameters.

In step S008, a predetermined operation is performed in accordance with the first signal. As the predetermined operation, determination of operational conditions of the storage battery 135 is performed, for example. As the determination of operational conditions of the storage battery 135, for example, the charging current and the upper charging voltage limit are changed. For example, the FCC of the storage batters 135 is estimated, and the charging current is decreased in accordance with a decrease in the FCC. This can inhibit a decrease in the discharge capacity of the storage battery 135. Alternatively, the upper charging voltage limit is changed so that a decrease in the capacity of the storage battery 135 can be inhibited. This can inhibit a decrease in the discharge capacity of the storage battery 135.

Alternatively, as the predetermined operation performed in Step S008, the storage batteries 135 are classified according to the first signal, for example. The classification is performed based on the estimated value of an impedance increase or the estimated value of a discharge capacity decrease, for example.

The processing ends in Step S099.

<Example of Learning>

Figure 4:
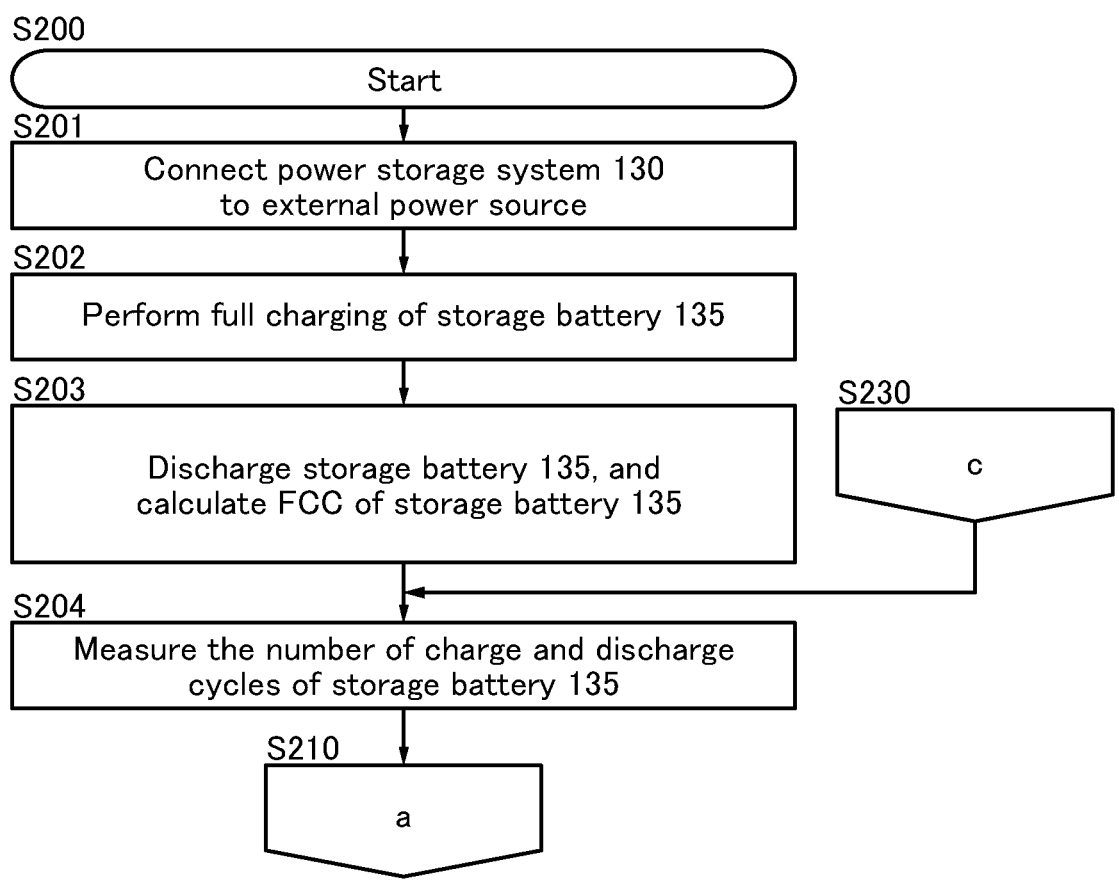
FIG. 4 A flow diagram showing an operation of a power storage system.
Figure 5:
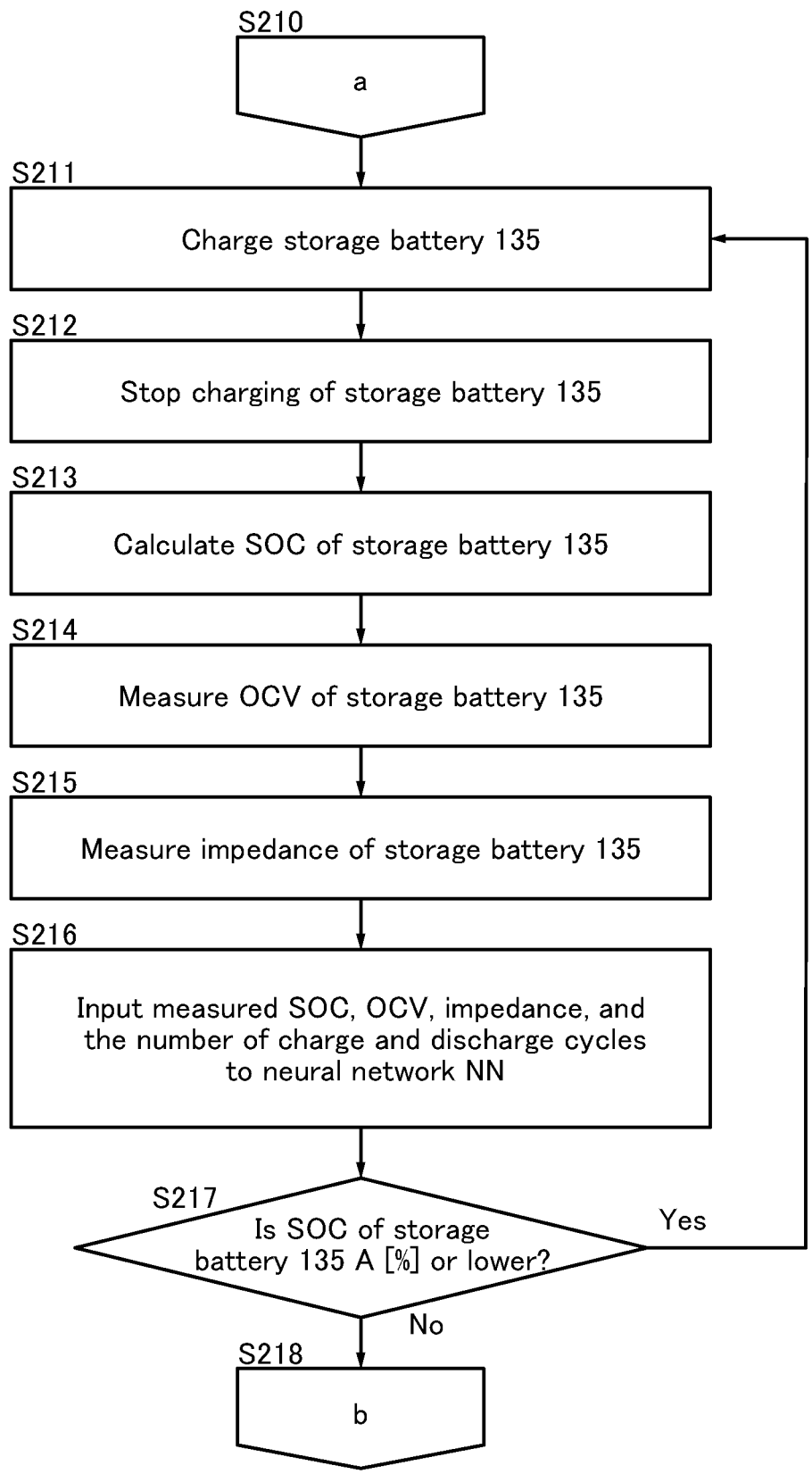
FIG. 5 A flow diagram showing an operation of a power storage system.

Flow diagrams shown in FIG. 4, FIG. 5, and FIG. 6(A) show an example of the case where learning is performed by the neural network NN included in the power storage system 130.

Step S200 to Step S204, Step S210, and Step S230 are described with reference to the flow diagram shown in FIG. 4.

The processing starts in Step S200.

In Step S201, the power storage system 130 is connected to the external power source. Electric power is supplied from the external power source to the power storage system 130. The power storage system 130 is not necessarily connected to the external power source.

In Step S202, full charging of the storage battery 135 is performed.

In Step S203, the storage battery 135 is discharged, and the FCC of the storage battery is calculated.

In Step S204, the number of charge and discharge cycles of the storage battery 135 is measured. Here, the number of charge and discharge cycles is the cumulative number of cycles in the steps from Step S202 to Step S204.

Step S210 is a connector a connected from Step S204 to Step S211 shown in the flow diagram shown in FIG. 5.

Step S230 is a connector c connected from Step S224 in the flow diagram shown in FIG. 6(A) to Step S204.

Step S211 to Step S218 are described with reference to the flow diagram shown in FIG. 5.

In Step S211 to Step S216, the storage battery 135 is charged, and the parameters of the storage battery 135 are measured.

In Step S211, the storage battery 135 is charged. Here, charging is performed such that the SOC decreases by, for example, greater than or equal to 5% and less than 40% or greater than or equal to 5% and less than 20%. For example, in the case where the SOC before charging is 80%, charging is performed so that the SOC becomes 55%, that is, the SOC decreases by 25%.

In Step S212, charging of the storage battery 135 is stopped,

In Step S213, the SOC of the storage battery 135 is calculated. For example, the SOC is calculated by obtaining the amount of charge stored from Step S211 to Step S212 using the full charge capacity of the storage battery which has been calculated in Step S203 as a reference.

In Step S214, the OCV of the storage battery 135 is measured.

In Step S215, the impedance of the storage battery 135 is measured.

In Step S216, the SOC calculated in Step S213, the OCV measured in Step S214, the impedance measured in Step S215, and the number of charge and discharge cycles calculated in Step S204 are input to the neural network NN.

Here, the measured OCV and impedance are correlated to the SOC, and the SOC, the OCV, and the impedance are correlated to the number of charge and discharge cycles.

If the SOC of the storage battery 135 is lower than or equal to A [%] in Step S217, the processing returns to Step S211. If the SOC is higher than A [%], the processing proceeds to Step S218.

Step S218 is a connector h connected from Step 217 to Step S222 shown in FIG. 6(A).

Step S222 to Step S225, Step 230, and Step S299 are described with reference to FIG. 6(A).

In Step S222, the storage battery 135 is discharged. For example, discharging is performed so that the SOC is higher than or equal to 0% and lower than 30%.

In Step S223, the discharge capacity is calculated and input to the neural network NN. Here, the discharge capacity is correlated to the number of charge and discharge cycles calculated in Step S204.

If the number of charge and discharge cycles of the storage battery 135 is smaller than or equal to x in Step S224, the processing proceeds to Step S230. If the number of charge and discharge cycles is larger than x, the processing proceeds to Step S225. Since Step S230 is the connector c connected from Step S224 to Step S204 shown in FIG. 4, the processing is sequentially performed from Step S204 on the basis of the flow diagram shown in FIG. 4 in the case where the number of charge and discharge cycles is smaller than or equal to x.

In Step S225, the weight coefficient of the neural network NN is adjusted such that an output desirable for the parameters input in Step S216 can be obtained. For example, the weight coefficient of the neural network NN is adjusted so that an output of the neural network NN of the case where the OCV and the impedance are input to the neural network NN becomes the value depending on the degradation rate of the discharge capacity associated with the charge and discharge cycles. More specifically, the value corresponding to the degradation rate of the discharge capacity after a predetermined number of charge and discharge cycles is output, for example.

Alternatively, the neural network NN may output a determination result. For example, adjustment is performed so that, when the degradation rate of the discharge capacity is a predetermined value or more, H1 or more here, the output of the neural network NN becomes the first signal, or so that, when the degradation rate is less than H1, the output of the neural network NN becomes a second signal different from the first signal. The first signal and the second signal are a high-potential signal and a low-potential signal, for example. Here, H1 is, for example, a value higher than or equal to 60% and lower than or equal to 98%, or higher than or equal to 70% and lower than or equal to 95%, of the capacity at the beginning of use or the standard capacity of the storage battery. Furthermore, H1 is measured after, for example, 10 or more, 50 or more, or 100 or more charge and discharge cycles are performed.

The processing ends in Step S299.

<Measurement Example of Impedance>

Figure 13A:
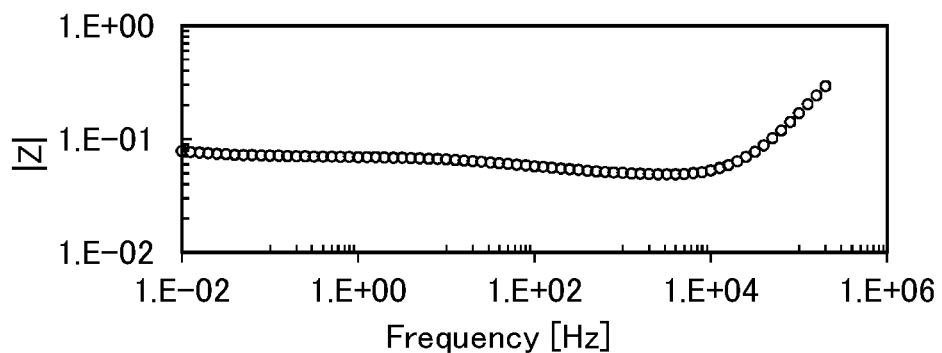
FIG. 13 Diagrams showing a measurement example of an impedance.
Figure 13B:
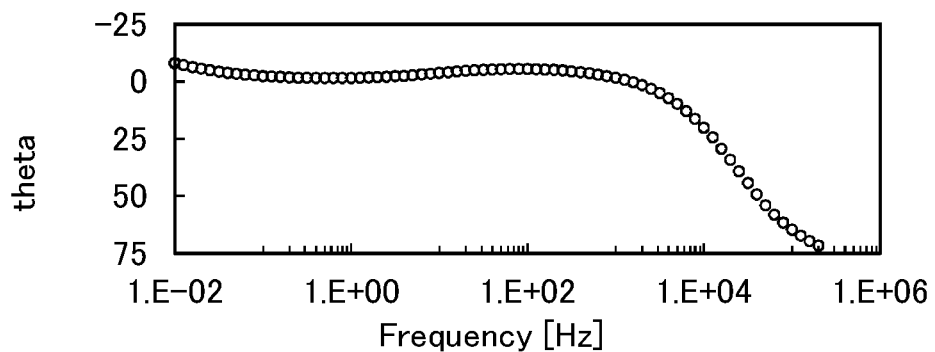
Figure 13C:
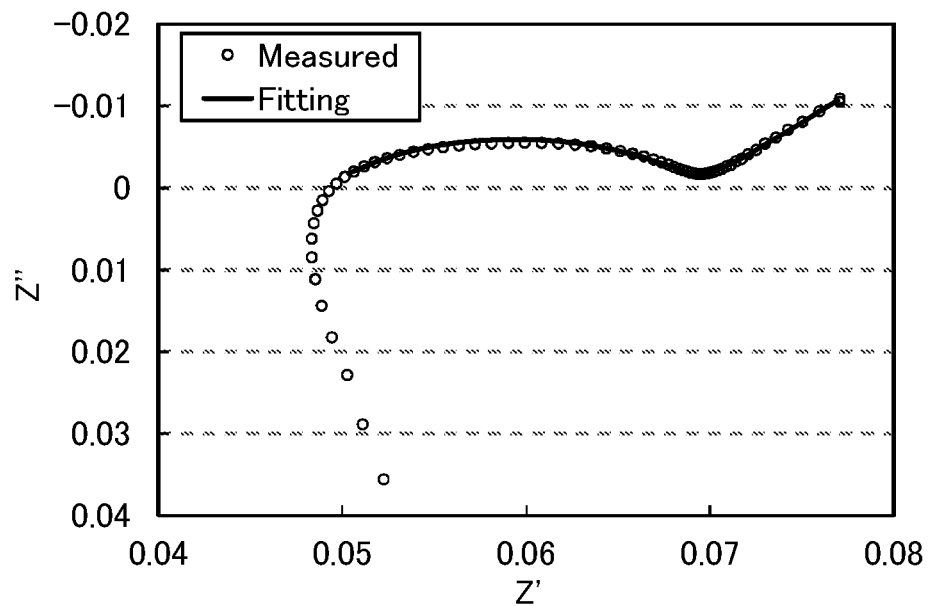

FIG. 13 shows measurement results of the impedance of the lithium-ion battery. In the range of 0001 Hz to 200 kHz, the impedance was measured by sweep at an amplitude of 15 mV from a high frequency to a low frequency. Celltest System by Solartron Analytical was used as an apparatus for the measurement. FIG. 13(A) is called a Gain plot (a Magnitude plot), where the horizontal axis represents frequency and the vertical axis represents the magnitude of the impedance, |Z|. FIG. 13(B) is called a Phase plot, where the horizontal axis represents frequency and the vertical axis represents the phase "theta". FIG. 13(C) is called a Nyquist plot, where the horizontal axis represents the real part (Z') of a frequency response and the vertical axis represents the imaginary part (Z") of the frequency response.

In FIG. 13(C), the dots represent measured values (Measured), and the solid line represents calculation results (Fitting) obtained using a model where n=1 in FIG. 6(C). The measured values and the calculation results obtained using the model showed favorable correspondence.

In the fitting, a CPE (Constant Phase Element) was used as a capacitor Ca_1 for the calculation. The impedance of the CPE is denoted by Z_CPE. The impedance Z_CPE can be represented by the following formula, where p is greater than or equal to 0 and less than or equal to 1 and T is a constant.

[Formula 1]

$$Z\_CPE = \frac{1}{(j\omega)^p T} \tag{B1}$$

This embodiment can be combined with the description of the other embodiments as appropriate.

Embodiment 2

This embodiment shows an example of a configuration of the neural network NN.

Figure 7:
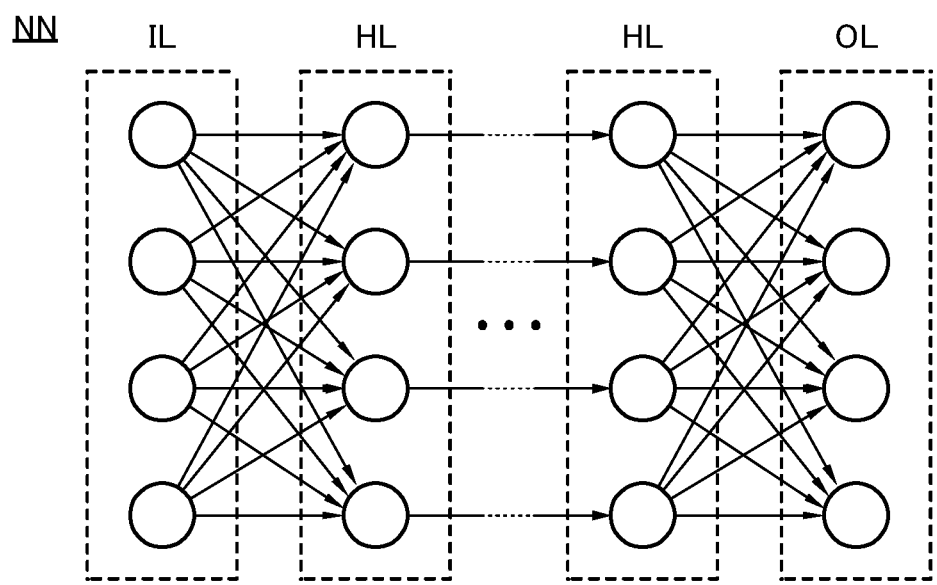
FIG. 7 A diagram showing a configuration example of a neural network.

FIG. 7 illustrates an example of a neural network of one embodiment of the present invention. The neural network NN illustrated in FIG. 7 includes an input layer IL, an output layer OL, and a hidden layer (middle layer) HL. The neural network NN can be formed of a neural network including a plurality of hidden layers HL, that is, a deep neural network. Learning in a deep neural network is referred to as deep learning in some cases. The output layer OL, the input layer IL, and the hidden layers HL each include a plurality of neuron circuits, and the neuron circuits provided in the different layers are connected to each other through a synapse circuit.

To the neural network NN, a function of analyzing an operation and a state of a storage battery is added by learning. When a parameter of the storage battery that has been measured is input to the neural network NN, arithmetic processing is performed in each layer. The arithmetic processing in each layer is executed by, for example, the product-sum operation of an output data of the neuron circuits in the previous layer and a weight coefficient. Note that the connection between layers may be a full connection where all of the neuron circuits are connected or a partial connection where some of the neuron circuits are connected.

For example, a convolutional neural network (CNN), which includes a convolutional layer and a pooling layer and in which only specific units in adjacent layers have connection, may be used. A CNN is used for image processing, for example. In the convolutional layer, a product-sum operation with image data and a filter is performed, for example. The pooling layer is preferably placed directly after the convolutional layer.

The convolutional layer has a function of performing convolution on image data. The convolution is performed by repetition of the product-sum operation of part of the image data and the filter value of a weight filter. By the convolution in the convolutional layer, a feature of an image is extracted.

In the convolution, a weight filter can be used. The image data input to the convolutional layer is subjected to filter processing using the filter.

The data subjected to the convolution is converted using an activation function, and then output to a pooling layer. As the activation function, ReLU (Rectified Linear Units) or the like can be used. ReLU is a function that outputs "0" when an input value is negative and outputs the input value as it is when the input value is greater than or equal to "0". As the activation function, a sigmoid function, a tan h function, or the like may be used as well.

The pooling layer has a function of performing pooling on the image data input from the convolutional layer. Pooling is processing in which the image data is partitioned into a plurality of regions, and predetermined data is extracted from each of the regions and arranged in a matrix. By the pooling, the image data is shrunk while the feature extracted by the convolutional layer remains. As the pooling, max pooling, average pooling, Lp pooling, or the like can be used.

In the CNN, feature extraction is performed using the above-described convolution processing and pooling processing. Note that the CNN can be composed of a plurality of convolutional layers CL and a plurality of pooling layers PL.

A fully-connected layer is preferably placed after several convolutional layers and several pooling layers that are arranged alternately, for example. A plurality of fully-connected layers may be placed. The fully-connected layer preferably has a function of determining an image using the image data subjected to the convolution processing and the pooling processing.

Next, configuration examples of the neural network NN having a learning function will be described. FIG. 8 illustrates configuration examples of the neural network NN. The neural network NN is composed of neuron circuits NC and synapse circuits SC provided between the neuron circuits.

Figure 8A:
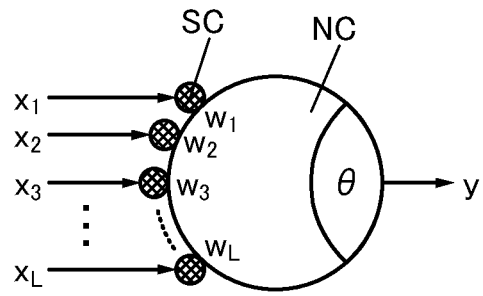
FIG. 8 Diagrams showing configurations examples of a neural network.

FIG. 8(A) illustrates a configuration example of a neuron circuit NC and synapse circuits SC which constitute the neural network NN. Input data $x_1$ to $x_L$ (L is a natural number) are input to the synapse circuits SC. In addition, the synapse circuits SC each have a function of storing a weight coefficient $w_k$ (k is an integer greater than or equal to 1 and less than or equal to L). The weight coefficient $w_k$ corresponds to the connection strength between the neuron circuits NC.

When the input data $x_1$ to $x_2$ are input to the synapse circuits SC, the sum of the products ($x_k w_k$) for k=1 to L (i.e., $x_1 w_1 + x_2 w_2 + \ldots + x_L w_L$) of input data $x_k$ input to the synapse circuit SC and the weight coefficient $wk$ stored in the synapse circuit SC, that is, a value obtained by the product-sum operation of $x_k$ and $w_k$ is supplied to the neuron circuit NC. When the value is larger than the threshold θ of the neuron circuit NC, the neuron circuit NC outputs a high-level signal y. This phenomenon is referred to as firing of the neuron circuit NC.

Figure 8B:
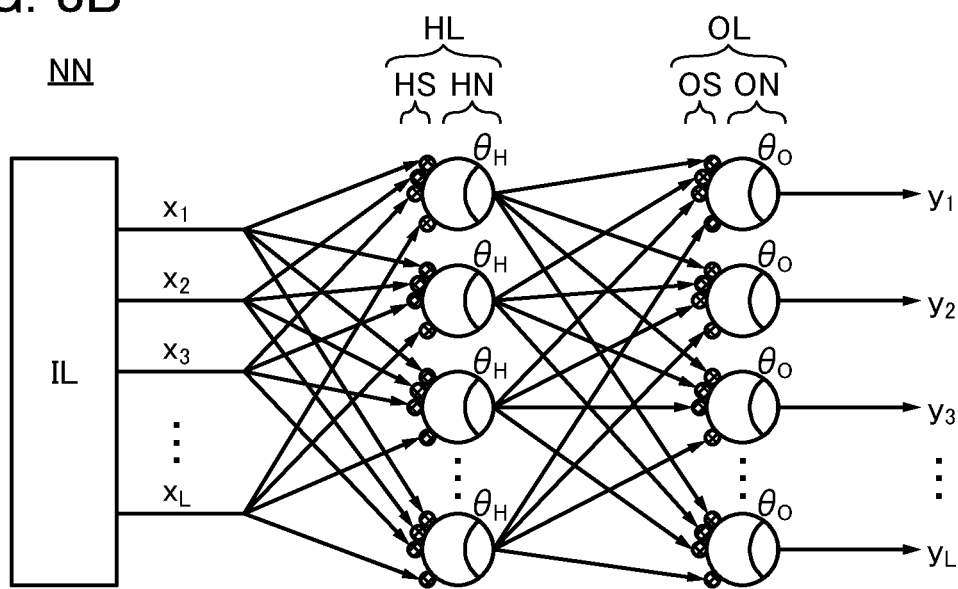

FIG. 8(B) shows a model of a hierarchical perceptron neural network NN using the neuron circuits NC and the synapse circuits SC. The neural network NN includes the input layer IL, the hidden layer (middle layer) HL, and the output layer OL.

The input data $x_1$ to $x_L$ are output from the input layer IL. The hidden layer HL includes hidden synapse circuits HS and hidden neuron circuits HN. The output layer OL includes output synapse circuits OS and output neuron circuits ON.

A value obtained by the product-sum operation using the input data $x_k$ and the weight coefficient $w_k$ that is held in the hidden synapse circuit HS is supplied to the hidden neuron circuit HN. Then, a value obtained by the product-sum operation using the output of the hidden neuron circuit HN and the weight coefficient $w_k$ that is held in the output synapse circuit OS is supplied to the output neuron circuit ON. Then, output data $y_1$ to $y_L$ are output from the output neuron circuits ON.

As described above, the neural network NN to which predetermined input data is supplied has a function of outputting, as output data, values corresponding to weight coefficients retained in the synapse circuits SC and the thresholds θ of the neuron circuits.

Figure 8C:
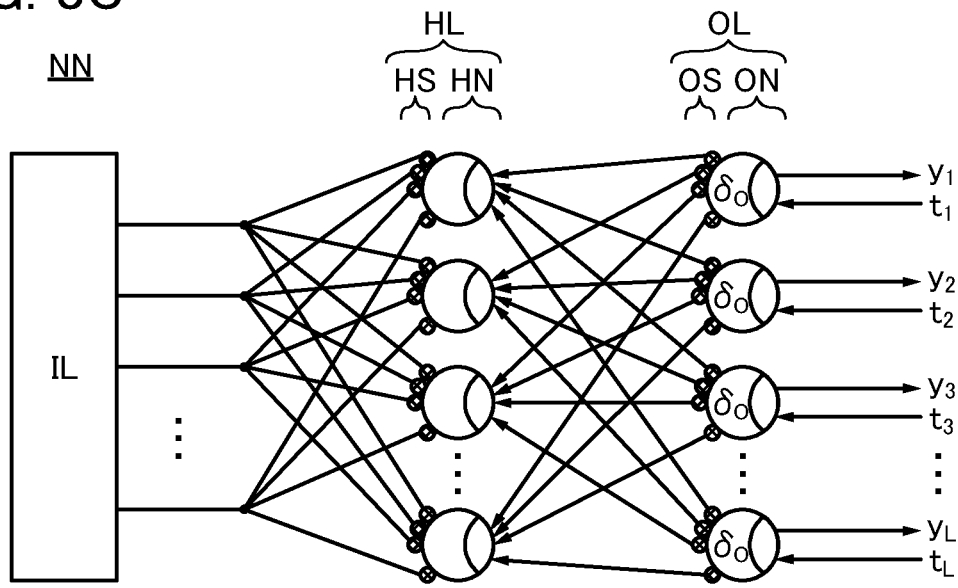

The neural network NN can perform supervised learning by the input of teacher data. FIG. 8(C) shows a model of the neural network NN which performs supervised learning using backpropagation.

The backpropagation method is a method of changing a weight coefficient $w_k$ of a synapse circuit so that the error between output data from a neural network and teacher data is reduced. Specifically, the weight coefficient $w_k$ of the hidden synapse circuit HS is changed in accordance with an error $\delta_O$ that is determined on the basis of the output data $y_1$ to $y_L$ and the teacher data $t_1$ to $t_L$. A weight coefficient $w_k$ of a synapse circuit SC in the previous layer is changed in accordance with the amount of change in the weight coefficient $w_k$ of the hidden synapse circuit HS. In this manner, weight coefficients of the synapse circuits SC are sequentially changed on the basis of the teacher data $t_1$ to $t_L$, so that the neural network NN can perform learning.

Note that one hidden layer HL is illustrated in FIG. 8(B) and FIG. 8(C) but the number of the hidden layers HL can be two or more. The use of a neural network including two or more hidden layers HL (a deep neural network (DNN)) enables deep learning. Accordingly, the accuracy of gray level correction can be increased.

This embodiment can be combined with the description of the other embodiments as appropriate.

Embodiment 3

In this embodiment, a specific example of an analog product-sum arithmetic circuit that can be used for the neural network described in the above embodiment is described.

Arithmetic processing in the whole neural networks illustrated in FIG. 7 and FIG. 8 are executed with an enormous number of product-sum operations. In the case where the arithmetic processing is performed by a digital circuit, a huge number of transistors are needed, resulting in inefficiency and high power consumption. Thus, the above product-sum operations are preferably performed by an analog product-sum operation circuit (hereinafter referred to as APS (Analog Product-Sum circuit)). The APS preferably includes an analog memory. The APS stores a weight coefficient obtained by learning, in the analog memory, whereby the APS can perform the product-sum operations using analog data as it is. Consequently, the APS enables a neural network to be formed efficiently with a small number of transistors.

Note that, in this specification, an analog memory refers to a memory device that can store analog data. In addition, analog data refers to data having a resolution of three bits (eight levels) or more in this specification. Multilevel data is referred to as analog data in some cases.

As the above analog memory, a multilevel flash memory, a ReRAM (Resistive Random Access Memory), an MRAM (Magnetoresistive Random Access Memory), or a memory using an OS transistor (hereinafter, OS memory) can be used.

The channel formation region of an OS transistor preferably includes a metal oxide. The metal oxide included in the channel formation region preferably contains indium (In). When the metal oxide included in the channel formation region is a metal oxide containing indium, the carrier mobility (electron mobility) of the OS transistor increases. The metal oxide included in the channel formation region is preferably an oxide semiconductor containing an element M. The element M is preferably aluminum (Al), gallium. (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that a plurality of the above-described elements is combined as the element M in some cases. The element M is an element having high bonding energy with oxygen, for example. The element M is an element having higher bonding energy with oxygen than indium, for example. The metal oxide included in the channel formation region is preferably a metal oxide containing zinc (Zn). A metal oxide containing zinc is easily crystallized in some cases.

Figure 9:
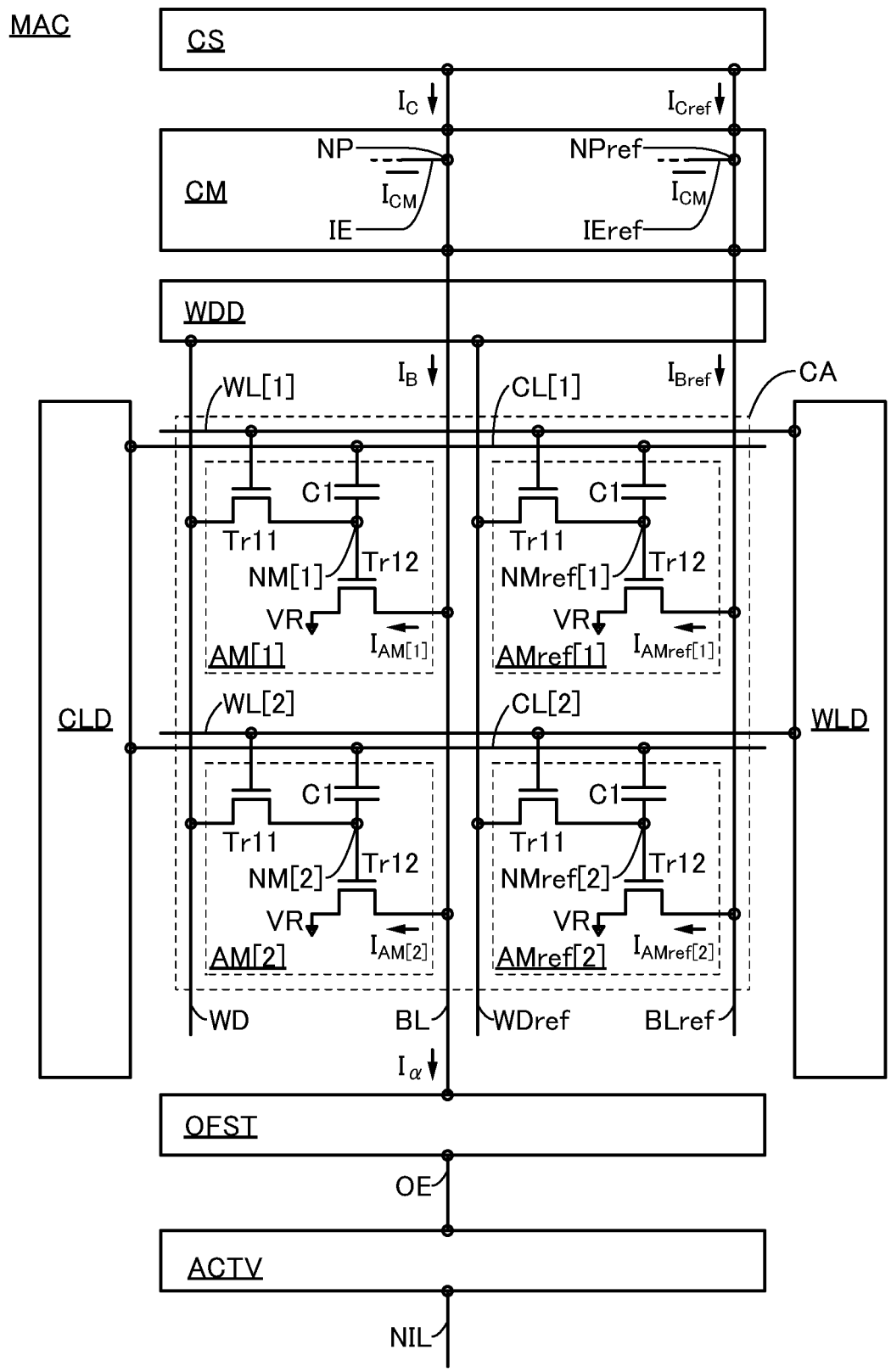
FIG. 9 A block diagram showing a configuration example of a product-sum arithmetic circuit.

The metal oxide included in the channel formation region is not limited to a metal oxide containing indium. The metal oxide included in the channel formation region may be a metal oxide that does not contain indium and contains zinc, a metal oxide that contains gallium, or a metal oxide that contains tin, e.g., zinc tin oxide or gallium tin oxide. FIG. 9 illustrates a configuration example of the product-sum operation circuit. A product-sum operation circuit MAC illustrated in FIG. 9 is a circuit that performs product-sum operation using first data retained in a memory cell described below and input second data. Note that the first data and the second data can be analog data or multilevel data (discrete data).

The product-sum operation circuit MAC includes a current supply circuit CS, a current mirror circuit CM, a circuit WDD, a circuit WLD, a circuit CLD, an offset circuit OFST, an activation function circuit ACTV, and a memory cell array CA.

The memory cell array CA includes a memory cell AM[1], a memory cell AM[2], a memory cell AMref[1], and a memory cell AMref[2]1. The memory cell AM[1] and the memory cell AM[2] each have a function of retaining the first data, and the memory cell AMref[1] and the memory cell AMref[1] each have a function of retaining reference data that is needed to perform product-sum operation. The reference data can be analog data or multilevel data (discrete data), like the first data and the second data.

In the memory cell array CA in FIG. 9, memory cells are arranged in a matrix of two rows and two columns; however, the memory cell array CA may have a configuration in which memory cells are arranged in a matrix of three or more rows and three or more columns. In the case where multiplication is performed instead of product-sum operation, the memory cell array CA may have a configuration in which memory cells are arranged in a matrix of one row and two or more columns.

The memory cell AM[1], the memory cell AM[2], the memory cell AM[2], and the memory cell AMref[2] each include a transistor Tr11, a transistor Tr12, and a capacitor C1.

Note that the transistor Tr11 is preferably an OS transistor.

The use of an OS transistor as the transistor Tr12 allows the transistor Tr12 to be formed concurrently with the transistor Tr11, leading to a reduction in the number of manufacturing steps for the product-sum operation circuit, in some cases. A channel formation region of the transistor Tr12 may be amorphous silicon, polycrystalline silicon, or the like instead of an oxide.

In each of the memory cell AM[1], the memory cell AM[2], the memory cell AMref[1], and the memory cell AMref[2], a first terminal of the transistor Tr11 is electrically connected to a wife of the transistor Tr12. A first terminal of the transistor Tr12 is electrically connected to a wiring VR. A first terminal of the capacitor C1 is electrically connected to the gate of the transistor Tr12.

In the memory cell AM[1], a second terminal of the transistor Tr11 is electrically connected to a wiring WD, and a gate of the transistor Tr11 is electrically connected to a wiring WL[1]. A second terminal of the transistor Tr12 is electrically connected to a wiring BL, and a second terminal of the capacitor C1 is electrically connected to a wiring CL[1]. In FIG. 9, in the memory cell AM[1] It a connection portion of the first terminal of the transistor Tr11, the gate of the transistor Tr12, and the first terminal of the capacitor C1 is a node NM[1]. In addition, a current that flows from the wiring BL to the second terminal of the transistor Tr12 is $I_{AM[1]}$.

In the memory cell AM[2], a second terminal of the transistor Tr11 is electrically connected to the wiring WD, and a gate of the transistor Tr11 is electrically connected to a wiring WL[2]. A second terminal of the transistor Tr12 is electrically connected to the wiring BL, and a second terminal of the capacitor C1 is electrically connected to a wiring CL[2]. In FIG. 9, in the memory cell AM[2], a connection portion of the first terminal of the transistor Tr11 the gate of the transistor Tr12, and the first terminal of the capacitor C1 is a node NM[2]. In addition, a current that flows from the wiring BL to the second terminal of the transistor Tr12 is $I_{AM[2]}$.

In the memory cell AMref[1], a second terminal of the transistor Tr11 is electrically connected to a wiring WDref, and a gate of the transistor Tr11 is electrically connected to the wiring WL[1]. A second terminal of the transistor Tr12 is electrically connected to a wiring BLref, and a second terminal of the capacitor C1 is electrically connected to the wiring CL[1]. In FIG. 9, in the memory cell AMref[1], a connection portion of the first terminal of the transistor Tr11, the gate of the transistor Tr12, and the first terminal of the capacitor C1 is a node NMref[1]. In addition, a current that flows from the wiring BLref to the second terminal of the transistor Tr12 is $I_{AMref[1]}$.

In the memory cell AMref[2], a second terminal of the transistor Tr11 is electrically connected to the wiring WDref, and a gate of the transistor Tr12 is electrically connected to the wiring WL[2]. A second terminal of the transistor Tr12 is electrically connected to the wiring BLref, and a second terminal of the capacitor C1 is electrically connected to the wiring CL[2]. In FIG. 9, in the memory cell AMref[2], a connection portion of the first terminal of the transistor Tr11, the gate of the transistor Tr12, and the first terminal of the capacitor C1 is a node NMref[2]. In addition, a current that flows from the wiring BLref to the second terminal of the transistor Tr12 is $I_{AMref[2]}$.

The node NM[1], the node NM[2], the node NMref[1], and the node NMref[2] described above function as retention nodes of their respective memory cells.

The wiring VR is a wiring for supplying current between the first terminal and the second terminal of the transistor Tr12 in each of the memory cell AM[1], the memory cell AM[2], the memory cell AMref[1], and the memory cell AMref[2]. Thus, the wiring VR functions as a wiring for supplying a predetermined potential. In this embodiment, a potential to be supplied from the wiring VR is a reference potential or a potential lower than the reference potential.

The current supply circuit CS is electrically connected to the wiring BL and the wiring BLref. The current supply circuit CS has a function of supplying current to the wiring BL and the wiring BLref. Note that the amounts of current supplied to the wiring BL and the wiring BLref may be different from each other. In this configuration example, a current that is supplied from the current supply circuit CS to the wiring BL is $I_C$, and a current that is supplied from the current supply circuit CS to the wiring BLref is $I_{Cref}$.

The current mirror circuit CM includes a wiring IE and a wiring IEref. The wiring IE is electrically connected to the wiring BL, and in FIG. 9, a connection portion of the wiring IE and the wiring BL is shown as a node NP. The wiring IEref is electrically connected to the wiring BLref, and in FIG. 9, a connection portion of the wiring IEref and the wiring BLref is shown as a node NPref. The current mirror circuit CM has a function of letting out current according to the potential of the node NPref from the node NPref of the wiring BLref to the wiring IEref, and letting out the same amount of current as the above current from the node NP of the wiring BL to the wiring IE. In FIG. 9, a current that is let out from the node NP to the wiring IE and a current that is let out from the node NPref to the wiring IEref are represented by $I_{CM}$. In addition, a current that flows from the current mirror circuit CM to the memory cell array CA in the wiring BL is represented by is, and a current that flows from the current mirror circuit CM to the memory cell array CA in the wiring BLref is represented by $I_{Bref}$.

The circuit WDD is electrically connected to the wiring WD and the wiring WDref. The circuit WDD has a function of transmitting data that is to be stored in each memory cell included in the memory cell array CA.

The circuit WLD is electrically connected to the wiring WL[1] and the wiring WL[2]. The circuit WLD has a function of selecting a memory cell to which data is written in data writing to the memory cell included in the memory cell array CA.

The circuit CLD is electrically connected to the wiring CL[1] and the wiring CL[2]. The circuit CLD has a function of applying a potential to the second terminal of a capacitor C of each memory cell included in the memory cell array CA.

The circuit OFST is electrically connected to the wiring BL and a wiring OE. The circuit OFST has a function of measuring the amount of current flowing from the wiring BL to the circuit OFST and/or the amount of change in current flowing from the wiring BL to the circuit OFST. In addition, the circuit OFST has a function of outputting the measurement result to the wiring OE. Note that the circuit OFST may have a configuration in which the measurement result is output as it is as current to the wiring OE or have a configuration in which the measurement result is converted into voltage and then output to the wiring OE. In FIG. 9, a current flowing from the wiring BL to the circuit OFST is represented $I_\alpha$.

Figure 10:
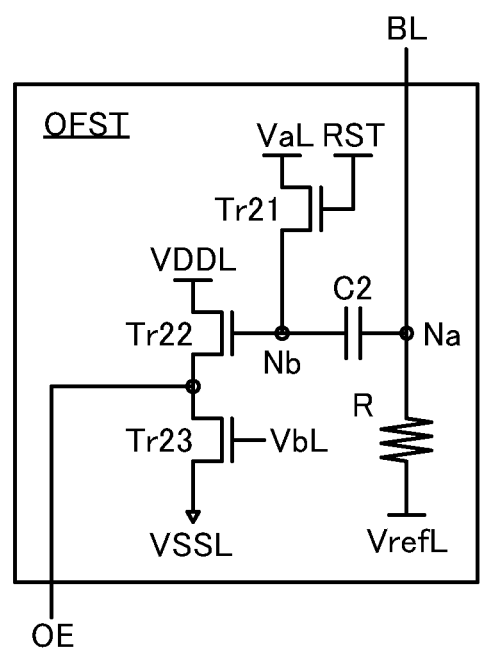
FIG. 10 A circuit diagram showing a configuration example of a circuit.

The circuit OFST can have a configuration in FIG. 10, for example. In FIG. 10, the circuit OFST includes a transistor Tr21, a transistor Tr22, a transistor Tr23, a capacitor C2, and a resistor R.

A first terminal of the capacitor C2 is electrically connected to the wiring BL, and a first terminal of the resistor R is electrically connected to the wiring BL. A second terminal of the capacitor C2 is electrically connected to a first terminal of the transistor Tr21, and the first terminal of the transistor Tr21 is electrically connected to a gate of the transistor Tr22. A first terminal of the transistor Tr22 is electrically connected to a first terminal of the transistor Tr23, and the first terminal of the transistor Tr23 is electrically connected to the wiring OE. An electrical connection point of the first terminal of the capacitor C2 and the first terminal of the resistor R is a node Na, and an electrical connection point of the second terminal of the capacitor C2, the first terminal of the transistor Tr21, and the gate of the transistor Tr22 is a node Nb.

A second terminal of the resistor R is electrically connected to a wiring VrefL. A second terminal of the transistor Tr21 is electrically connected to a wiring VaL, and a gate of the transistor Tr21 is electrically connected to a wiring RST. A second terminal of the transistor Tr22 is electrically connected to a wiring VDDL. A second terminal of the transistor Tr23 is electrically connected to a wiring VSSL, and a gate of the transistor Tr23 is electrically connected to a wiring VbL.

The wiring VrefL is a wiring for supplying a potential Vref, the wiring VaL is a wiring for supplying a potential Va, and the wiring VbL is a wiring for supplying a potential Vb. The wiring VDDL is a wiring for supplying a potential VDD, and the wiring VSSL is a wiring for supplying a potential VSS. Particularly in this configuration example of the circuit OFST, the potential VDD is a high-level potential and the potential VSS is a low-level potential. The wiring RST is a wiring for supplying a potential for switching the conduction state and the non-conduction state of the transistor Tr21.

In the circuit OFST illustrated in FIG. 10, a source follower circuit is composed of the transistor Tr22, the transistor Tr23, the wiring VDDL, the wiring VSSL, and the wiring VbL.

In the circuit OFST illustrated in FIG. 10, owing to the resistor R and the wiring VrefL, a potential according to current flowing through the wiring BL and the resistance of the resistor R is supplied to the node Na.

An operation example of the circuit OFST illustrated in FIG. 10 is described. When first-time current (hereinafter referred to as first current) flows through the wiring BL, a potential according to the first current and the resistance of the resistor R is supplied to the node Na owing to the resistor R and the wiring VrefL. At this time, the transistor Tr21 is brought into a conduction state so that the potential Va is supplied to the node Nb. After that, the transistor Tr21 is brought into a non-conduction state.

Next, when second-time current (hereinafter referred to as second current) flows through the wiring BL, a potential according to the second current and the resistance of the resistor R is supplied to the node Na owing to the resistor R and the wiring VrefL as in the case where the first current flows. At this time, the node Nb is in a floating state; thus, a change in the potential of the node Na changes the potential of the node Nb because of capacitive coupling. When the change in the potential of the node Na is $\Delta V_{Na}$ and the capacitive coupling coefficient is 1, the potential of the node Nb is Va+$\Delta V_{Na}$. When the threshold voltage of the transistor Tr22 is $V_{th}$, a potential Va+$\Delta V_{Na}$−$V_{th}$ is output through the wiring OE. When the potential Va is the threshold voltage $V_{th}$ here, a potential $\Delta V_{Na}$ can be output through the wiring OE.

The potential $\Delta V_{Na}$ is determined by the amount of change from the first current to the second current, the resistor R, and the potential Vref. The resistor R and the potential Vref can be regarded as known; therefore, the use of the circuit OFST illustrated in FIG. 10 allows the amount of change in current flowing through the wiring BL to be obtained from the potential $\Delta V_{Na}$.

The activation function circuit ACTV is electrically connected to the wiring OE and a wiring NIL. The result of the variation in the amount of current measured by the circuit OFST is input to the activation function circuit ACTV through the wiring OE. The activation function circuit ACTV is a circuit that performs arithmetic operation according to a function system defined in advance, on the result. As the function system, for example, a sigmoid function, a tan h function, a softmax function, a ReLU function, a threshold function, or the like can be used, and these functions are used as activation functions in a neural network.

<Operation Example of Product-Sum Operation Circuit>

Next, an operation example of the product-sum operation circuit MAC is described.

Figure 11:
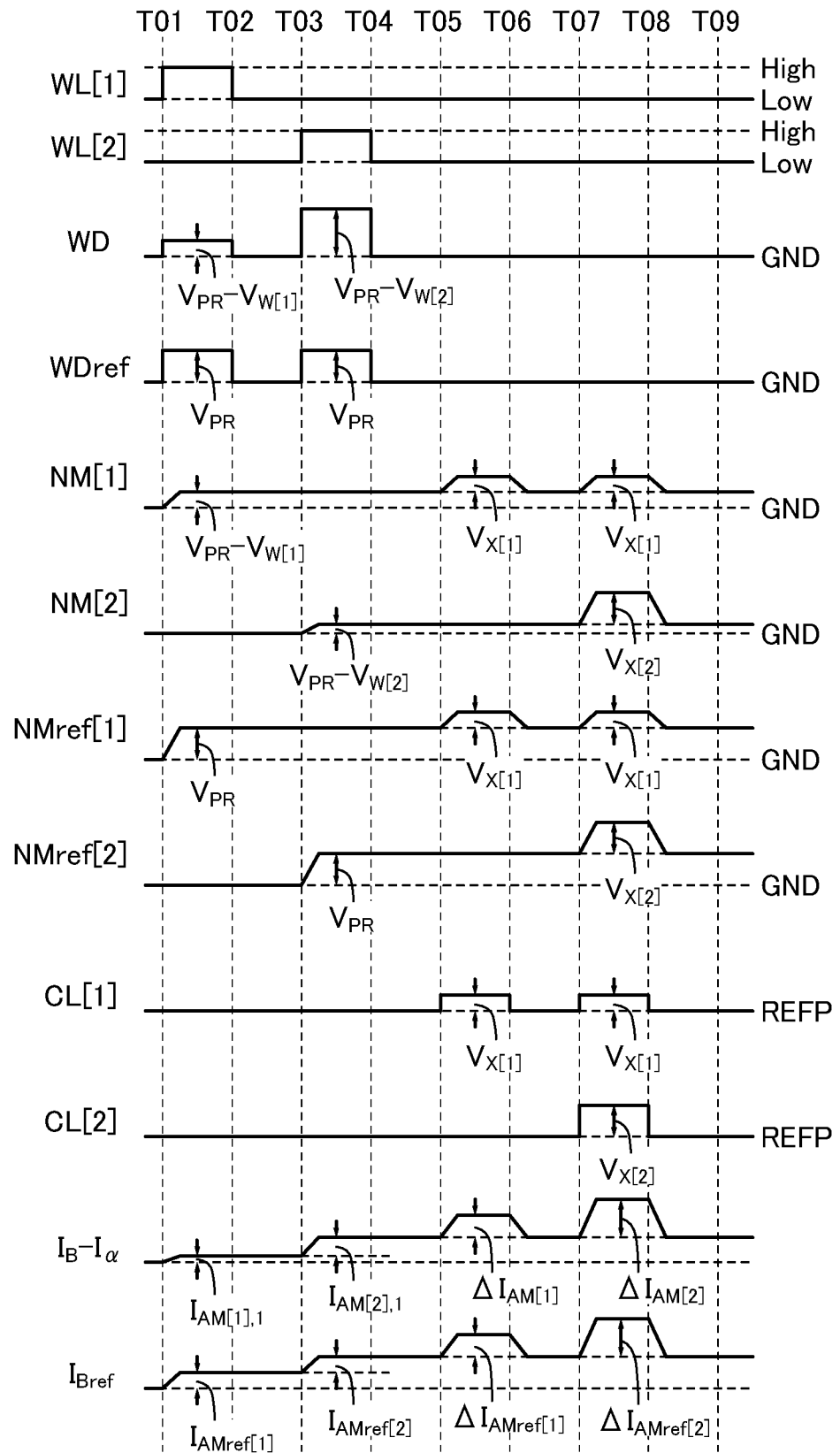
FIG. 11 A timing chart showing an operation example of a product-sum arithmetic circuit.

FIG. 11 shows a timing chart of the operation example of the product-sum operation circuit MAC. The timing chart of FIG. 11 shows changes in the potentials of the wiring WM[1], the wiring WL[2], the wiring WD, the wiring WDref, the node NM[1], the node NM[2], the node NMref [1], the node NMref[2], the wiring CL[1], and the wiring CL[2] and changes in the amounts of current $I_B-I_\alpha$ and current $I_{Bref}$ from Time T01 to Time T09. In particular, the current $I_B-I_\alpha$ represents the total amount of current that flows from the wiring BL to the memory cell AM[1] and the memory cell AM[2] in the memory cell array CA.

<<From Time T01 to Time T02>>

During a period from Time T01 to Time T02, a high-level potential (denoted by High in FIG. 11) is applied to the wiring WL[1], and a low-level potential (denoted by Low in FIG. 11) is applied to the wiring WL[2]. Furthermore, a potential higher than a ground potential (denoted by GND in FIG. 11) by $V_{PR}-V_{W[1]}$ is applied to the wiring WD, and a potential higher than the ground potential by $V_{PR}$ is applied to the wiring WDref. Moreover, a reference potential (denoted by REFP in FIG. 11) is applied to each of the wiring CL[1] and the wiring CL[2].

The potential $V_{W[1]}$ is a potential corresponding to one piece of the first data. The potential $V_{PR}$ is a potential corresponding to the reference data.

At this time, the high-level potential is applied to each of the gates of the transistors Tr11 in the memory cell AMP and the memory cell AMref[1], and the transistors Tr11 in the memory cell AM[1] and the memory cell AMref[1] are each brought into a conduction state. Thus, the potential of the node NM[1] becomes $V_{PR}-V_{W[1]}$, and the potential of the node NMref[1] becomes $V_{PR}$.

When the current flowing from the wiring BL to the first terminal of the transistor Tr12 in the memory cell AM[1] through its second terminal is $I_{AM[1],0}$, $I_{AM[1],0}$ can be expressed by the following formula.

[Formula 2]

$$I_{AM[1],0}=k(V_{PR}-V_{W[1]}-V_{th})^2 \qquad (E1)$$

Note that k is a constant determined by the channel length, the channel width, the mobility, the capacitance of a gate insulating film, and the like of the transistor Tr12. Furthermore, $V_{th}$ is the threshold voltage of the transistor Tr12.

When current flowing from the wiring BLref to the first terminal of the transistor Tr12 in the memory cell AMref[1] through its second terminal is $I_{AMref[1],0}$, $I_{AMref[1],0}$ can be expressed similarly by the following formula.

[Formula 3]

$$I_{AMref[1],0}=k(V_{PR}-V_{th})^2 \qquad (E2)$$

Note that since the low-level potential is applied to each of the gates of the transistors Tr11 in the memory cell AM[2] and the memory cell AMref[2], the transistors Tr11 in the memory cell AM[2] and the memory cell AMref[2] are each brought into a non-conduction state. Thus, the potentials are not written to the node NM[2] and the node NMref[2].

<<From Time T02 to Time T03>>

During a period from Time T02 to Time T03, the low-level potential is applied to the wiring WL[1]. At this time, the low-level potential is applied to each of the gates of the transistors Tr11 in the memory cell AM[1] and the memory cell AMref[1]; accordingly, the transistors Tr11 in the memory cell AM[1] and the memory cell AMref[1] are each brought into a non-conduction state.

In addition, the low-level potential remains applied to the wiring WL[2] from before Time T02. Thus, the transistors Tr11 in the memory cell AM[2] and the memory cell AMref[2] each remain in a non-conduction state since before Time T02. Thus, the potentials of the node NM[1], the node NM[2], the node NMref[1], and the node NMref[2] are each retained during the period from Time T02 to Time T03. When OS transistors are used as the transistors Tr11, the leakage current flowing between the first terminals and the second terminals of the transistors Tr11 can be made low, which makes it possible to retain the potential at each node for a long time. Since the ground potential is applied to the wiring WD and the wiring WDref and the transistors Tr11 are in off states, the potentials retained at the nodes are not rewritten by applying potentials from the wiring WD and the wiring WDref.

<<From Time T03 to Time T04>>

During a period from Time T03 to Time T04, the low-level potential is applied to the wiring WL[1], and the high-level potential is applied to the wiring WL[2]. Furthermore, a potential higher than the ground potential by $V_{PR}-V_{w[2]}$ is applied to the wiring WD, and a potential higher than the ground potential by $V_{PR}$ is applied to the wiring WDref. Moreover, the reference potential is continuously applied to each of the wiring CL[1] and the wiring CL[2] since before Time T02.

Note that the potential $V_{w[2]}$ is a potential corresponding to one piece of the first data.

At this time, the high-level potential is applied to each of the gates of the transistors Tr11 in the memory cell AM[2] and the memory cell AMref[2]; accordingly, the transistors Tr11 in the memory cell AM[2] and the memory cell AMref[2] are each brought into a conduction state. Thus, the potential of the node NM[2] becomes $V_{PR}-V_{W[2]}$, and the potential of the node NMref[2] becomes $V_{PR}$.

When the current flowing from the wiring BL to the first terminal of the transistor Tr12 in the memory cell AM[2] through its second terminal is $I_{AM[2],0}$, $I_{AM[2],0}$ can be expressed by the following formula.

[Formula 4]

$$I_{AM[2],0}=k(V_{PR}-V_{W[2]}-V_{th})^2 \qquad (E3)$$

When current flowing from the wiring BLref to the first terminal of the transistor Tr12 in the memory cell AMref[2] through its second terminal is $I_{AMref[2],0}$, $I_{AMref[2],0}$ can be expressed similarly by the following formula.

[Formula 5]

$$I_{AMref[2],0}=k(V_{PR}-V_{th})^2 \qquad (E4)$$

<<From Time T04 to Time T05>>

Here, currents that flow in the wiring BL and the wiring BLref during a period from Time T04 to Time T05 are described.

Current from the current supply circuit CS is supplied to the wiring BLref. In addition, current is let out by the current mirror circuit CM, the memory cell AMref[1], and the memory cell AMref[2] to the wiring BLref. When the current supplied from the current supply circuit CS is $I_{Cref}$ and the current let out by the current mirror circuit CM is $I_{CM,0}$ in the wiring BLref, the following formula is satisfied according to Kirchhoff's law.

[Formula 6]

$$I_{Cref} - I_{CM,0} = I_{AMref[1],0} + I_{AMref[2],0} \quad (E5)$$

When the current supplied from the current supply circuit CS is $I_{C,0}$ and the current that flows from the wiring BL to the circuit OFST is $I_{\alpha,0}$ in the wiring BL, the following formula is satisfied according to Kirchhoff's law.

[Formula 7]

$$I_C - I_{CM,0} = I_{AM[1],0} + I_{AM[2],0} + I_{\alpha,0} \quad (E6)$$

<<From Time T05 to Time T06>>

During a period from Time T05 to Time T06, a potential higher than the reference potential by $V_{X[1]}$ is applied to the wiring CL[1]. At this time, the potential $V_{X[1]}$ is applied to the second terminal of the capacitor C1 in each of the memory cell AM[1] and the memory cell AMref[1], so that the potentials of the gates of the transistors Tr12 increase.

The potential $V_{X[1]}$ is a potential corresponding to one piece of the second data.

Note that an increase in the potential of the gate of the transistor Tr12 corresponds to a potential obtained by multiplying a change in the potential of the wiring CL[1] by a capacitive coupling coefficient determined by the memory cell configuration. The capacitive coupling coefficient is calculated using the capacitance of the capacitor C1, the gate capacitance of the transistor Tr2, and the parasitic capacitance. In this operation example, to avoid complexity of description, description is made on the assumption that an increase in the potential of the wiring CL[1] is equal to the increase in the potential of the gate of the transistor Tr12. This corresponds to the case where the capacitive coupling coefficient in each of the memory cell AM[1] and the memory cell AMref[1] is set to 1.

Since the capacitive coupling coefficient is set to 1, when the potential $V_{X[1]}$ is applied to the second terminal of the capacitor C1 in each of the memory cell AM[1] and the memory cell AMref[1], the potentials of the node NM[1] and the node NMref[1] each increase by $V_{X[1]}$.

Here, the current flowing from the second terminal to the first terminal of the transistor Tr12 in each of the memory cell AM[1] and the memory cell AMref[1] is considered. When the current flowing from the wiring BL to the first terminal of the transistor Tr12 in the memory cell AM[1] through its second terminal is $I_{AM[1],1}$, $I_{AM[1],1}$ can be expressed by the following formula.

[Formula 8]

$$I_{AM[1],1} = k(V_{PR} - V_{W[1]} + V_{X[1]} - V_{th})^2 \quad (E7)$$

In other words, by application of the potential $V_{X[1]}$ to the wiring CL[1], the current flowing from the wiring BL to the first terminal of the transistor Tr12 in the memory cell AM[1] through its second terminal increases by $I_{AM[1],1} - I_{AM[1],0}$ (denoted by $\Delta I_{AM[1]}$ in FIG. 11).

Similarly, when current flowing from the wiring BLref to the first terminal of the transistor Tr12 in the memory cell AMref[1] through its second terminal is $I_{AMref[1],1}$, $I_{AMref[1],1}$ can be expressed by the following formula.

[Formula 9]

$$I_{AMref[1],1} = k(V_{PR} + V_{X[1]} - V_{th})^2 \quad (E8)$$

In other words, by application of the potential $V_{X[1]}$ to the wiring CL[1], the current flowing from the wiring BLref to the first terminal of the transistor Tr12 in the memory cell AMref[1] through its second terminal increases by $I_{AMref[1],1} - I_{Amref[1],0}$ (denoted by $\Delta I_{AMref[1]}$ in FIG. 11).

When the current let out by the current mirror circuit CM is $I_{CM,1}$ in the wiring BLref, the following formula is satisfied according to Kirchhoff's law.

[Formula 10]

$$I_{Cref} - I_{CM,1} = I_{AMref[1],1} + I_{AMref[2],0} \quad (E9)$$

When the current that flows from the wiring BL to the circuit OFST is $I_{\alpha,1}$ in the wiring BL, the following formula is satisfied according to Kirchhoff's law.

[Formula 11]

$$I_C - I_{CM,1} = I_{AM[1],1} + I_{AM[2],0} + I_{\alpha,1} \quad (E10)$$

Note that $\Delta I_\alpha$ represents the difference between the current $I_{\alpha,0}$ flowing from the wiring BL to the wiring OFST during the period from Time T04 to Time T05 and the current $I_{\alpha,1}$ flowing from the wiring BL to the wiring OFST during the period from Time T05 to Time T06. Hereinafter, $\Delta I_\alpha$ is referred to as a difference current in the product-sum operation circuit MAC. The difference current $\Delta I_\alpha$ can be expressed by the following formula, using Formula (E1) to Formula (E10).

[Formula 12]

$$\Delta I_\alpha = I_{\alpha,1} - I_{\alpha,0} = 2kV_{W[1]}V_{X[1]} \quad (E11)$$

<<From Time T06 to Time T07>>

During a period from Time T06 to Time T07, the ground potential is applied to the wiring CL[1]. At this time, the ground potential is applied to the second terminal of the capacitor C1 in each of the memory cell AM[1] and the memory cell AMref[1]; thus, the potentials of the node NM[1] and the node NMref[1] return to the potentials during the period from Time T04 to Time T05.

<<From Time T07 to Time T08>>

During a period from Time T07 to Time T08, a potential higher than the reference potential by $V_{X[1]}$ is applied to the wiring CL[1], and a potential higher than the reference potential by $V_{X[2]}$ is applied to the wiring CL[2]. At this time, the potential $V_{X[1]}$ is applied to the second terminal of the capacitor C1 in each of the memory cell AM[1] and the memory cell AMref[1], and the potential $V_{X[2]}$ is applied to the second terminal of the capacitor C1 in each of the memory cell AM[2] and the memory cell AMref[2]. Consequently, the potential of the gate of the transistor Tr12 in each of the memory cell AM[1], the memory cell AM[2], the memory cell AMref[1], and the memory cell AMref[2] increases.

When the current flowing from the wiring BL to the first terminal of the transistor Tr12 in the memory cell AM[2] through its second terminal is $I_{AM[2],1}$, $I_{AM[2],1}$ can be expressed by the following formula.

[Formula 13]

$$I_{AM[2],1} = k(V_{PR} - V_{W[2]} + V_{X[2]} - V_{th})^2 \quad (E12)$$

Similarly, when current flowing from the wiring BLref to the first terminal of the transistor Tr12 in the memory cell AMref[2] through its second terminal is $I_{AMref[2],1}$, $I_{AMref[2],1}$ can be expressed by the following formula.

[Formula 14]

$$I_{AMref[2],1} = k(V_{PR} + V_{X[2]} + V_{th})^2 \quad (E13)$$

When the current let out by the current mirror circuit CM is $I_{CM}$ in the wiring BLref, the following formula is satisfied according to Kirchhoff's law.

[Formula 15]

$$I_{Cref} - I_{Cm,2} = I_{AMref[1],1} + I_{AMref[2],1} \quad (E14)$$

When the current that flows from the wiring BL to the circuit OFST is $I_{\alpha,3}$ in the wiring BL, the following formula is satisfied according to Kirchhoff's law.

[Formula 16]

$$I_C - I_{CM0,2} = I_{AM[1],1} + I_{AM[2],1} + I_{\alpha,3} \quad (E15)$$

The difference current the difference between the current flowing from the wiring BL to the wiring OFST during the period from Time T04 to Time T05 and the current $I_{\alpha,3}$ flowing from the wiring BL to the wiring OFST during the period from Time T07 to Time T08, can be expressed by the following formula, using Formula (E1) to Formula (E8) and Formula (E12) to Formula (E15).

[Formula 17]

$$\Delta I_\alpha = I_{\alpha,0} - I_{\alpha,3} = 2k(V_{W[1]}V_{X[1]} + V_{W[2]}V_{X[2]}) \quad (E16)$$

As shown by Formula (E16), the difference current $\Delta I_\alpha$ input to the circuit OFST has a value corresponding to the sum of products of the potential $V_W$, which is a plurality of pieces of the first data, and the potential $V_X$, which is a plurality of pieces of the second data. In other words, when the difference current $\Delta I_\alpha$ is measured by the circuit OFST, the value of the sum of products of the first data and the second data can be obtained.

<<From Time T08 to Time T09>>

During a period from Time T08 to Time T09, the reference potential is applied to the wiring CL[1] and the wiring CL[2]. At this time, the reference potential is applied to the second terminal of the capacitor C1 in each of the memory cell AM[1], the memory cell AM[2], the memory cell AMref[1], and the memory cell AMref[2]; thus, the potentials of the node NN[1], the node NM[2], the node NMref [1], and the node NMref[2] return to the potentials during the period from Time T06 to Time T07.

Although $V_{W[1]}$ was applied to the wiring CL[1] during the period from Time T05 to Time T06 and $V_{X[1]}$ and $V_{X[2]}$ were applied to the wiring CL[1] and the wiring CL[2], respectively, during the period from Time T07 to Time T08, potentials that are applied to the wiring CL[1] and the wiring CL[2] may be lower than the reference potential REFP In the case where a potential lower than the reference potential REFP is applied to the wiring CL[1] and/or the wiring CL[2], the potential of a retention node of a memory cell connected to the wiring RW[1] and/or the wiring CL[2] can be decreased by capacitive coupling. Thus, multiplication of the first data and one piece of the second data, which is a negative value, can be performed in the product-sum operation. For example, in the case where $-V_{X[2]}$, instead of $V_{X[2]}$, is applied to the wiring CL[2] during the period from Time T07 to Time T08, the difference current $\Delta I_\alpha$ can be expressed by the following formula.

[Formula 18]

$$\Delta I_\alpha = I_{\alpha,3} - I_{\alpha,3} = 2k(V_{W[1]}V_{X[1]} V_{W[2]}V_{X[2]}) \quad (E17)$$

Although the memory cell array CA including memory cells arranged in a matrix of two rows and two columns is used in this operation example, product-sum operation can be similarly performed in a memory cell array of one row and two or more columns and a memory cell array of three or more rows and three or more columns. In a product-sum operation circuit of such a case, memory cells in one of the plurality of columns are used for retaining reference data (potential $V_{PR}$), whereby product-sum operations, the number of which corresponds to the number of the rest of the columns among the plurality of columns, can be executed concurrently. That is, when the number of columns in a memory cell array is increased, an arithmetic circuit that achieve high-speed product-sum arithmetic processing can be provided. Furthermore, increasing the number of rows allows an increase in the number of terms to be added to each other in the product-sum operation. The difference current when the number of rows is increased can be expressed by the following formula.

[Formula 19]

$$\Delta I_\alpha = 2k \sum_i V_{W[i]} V_{X[i]} \quad (E18)$$

By the way, in the product-sum operation circuit described in this embodiment, the number of the rows of the memory cells AM corresponds to the number of neurons in the previous layer. In other words, the number of the rows of the memory cells AM corresponds to the number of output signals of the neurons in the previous layer that are input to the next layer. The number of the columns of the memory cells AM corresponds to the number of neurons in the next layer. In other words, the number of the columns of the memory cells AM corresponds to the number of output signals of the neurons that are output from the next layer. That is to say, the number of the rows and the number of the columns of the memory cell array of the product-sum operation circuit are determined depending on the number of neurons in each of the previous layer and the next layer; thus, a neural network is designed by determining the number of the rows and the number of the columns of the memory cell array depending on the desired configuration.

This embodiment can be combined with the description of the other embodiments as appropriate.

Embodiment 4

This embodiment shows examples of structures applicable to the power storage system of one embodiment of the present invention.

[Cylindrical Secondary Battery]

Figure 14A:
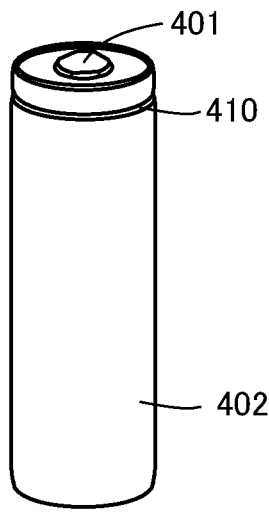
FIG. 14 Examples of structures of a storage battery.

An example of a cylindrical secondary battery is described with reference to FIG. 14(A). A cylindrical secondary battery 400 includes, as illustrated in FIG. 14(A), a positive electrode cap (battery lid) 401 on the top surface and a battery can (outer can) 402 on the side and bottom surfaces. The positive electrode cap 401 and the battery can (outer can) 402 are insulated from each other by a gasket (insulating packing) 410.

Since the positive electrode and the negative electrode of the cylindrical secondary battery are wound, active materials are preferably formed on both sides of the current collectors. A positive electrode terminal (positive electrode current collecting lead) 403 is connected to the positive electrode 404, and a negative electrode terminal (negative electrode current collecting lead) 407 is connected to the negative electrode 406. Both the positive electrode terminal 403 and the negative electrode terminal 407 can be formed using a metal material such as aluminum. The negative electrode terminal 407 is welded to the bottom of the battery can 402. The positive electrode terminal 403 is welded to a conductive plate 419, and is electrically connected to the positive electrode cap 401 through an explosion-proof plate 412 and a PTC (Positive Temperature Coefficient) element 411. The PTC element 411, which serves as a thermally sensitive resistor whose resistance increases as temperature rises, limits the amount of current by increasing the resistance, in order to prevent abnormal heat generation. Barium titanate ($BaTiO_3$)-based semiconductor ceramic or the like can be used for the PTC element.

Figure 14B:
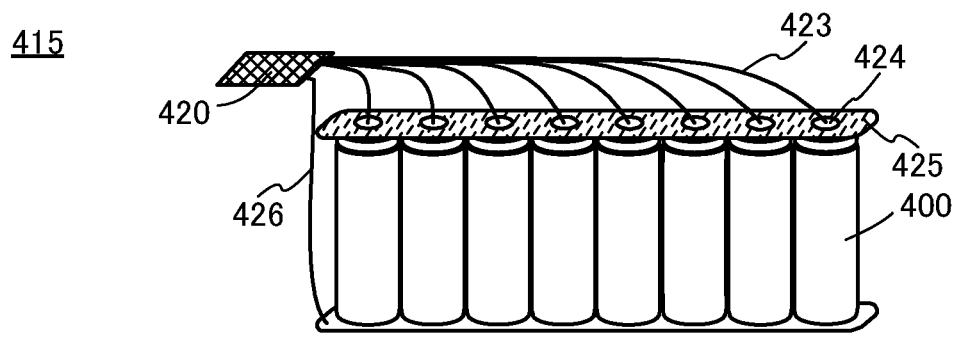

FIG. 14(B) illustrates an example of a power storage system 415. The power storage system 415 includes a plurality of secondary batteries 400. Positive electrodes of the secondary batteries are in contact with conductors 424 isolated by an insulator 425 and are electrically connected. The conductor 424 is electrically connected to a control system 420 through a wiring 423. Negative electrodes of the secondary batteries are electrically connected to the control system 420 through a wiring 426. As the control system 420, the control system described in the above embodiment can be used.

Figure 14C:
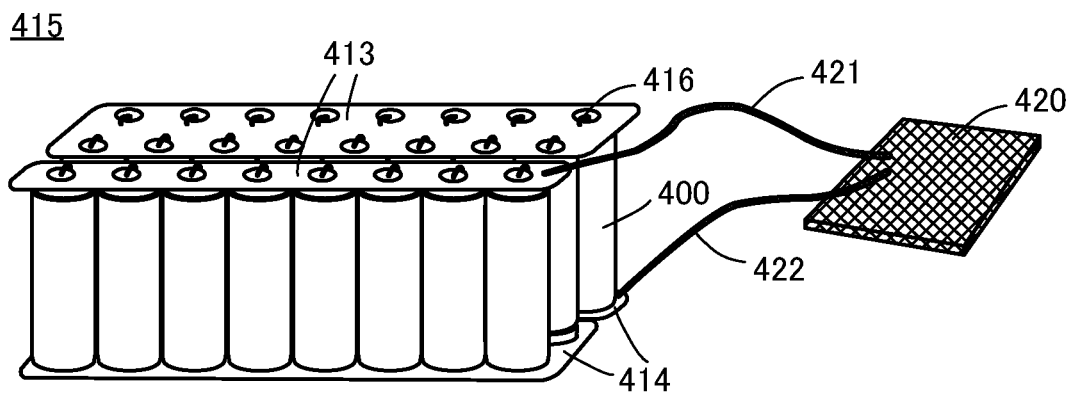

FIG. 14(C) illustrates an example of the power storage system 415. The power storage system 415 includes the plurality of secondary batteries 400, and the plurality of secondary batteries 400 are sandwiched between a conductive plate 413 and a conductive plate 414. The plurality of secondary batteries 400 are electrically connected to the conductive plate 413 and the conductive plate 414 through the wiring 416. The plurality of secondary batteries 400 may be connected parallel to each other, connected in series, or connected in series after being connected parallel to each other. With the power storage system 415 including the plurality of secondary batteries 400, large electric power can be extracted.

A temperature control device may be provided between the plurality of secondary batteries 400. When the secondary batteries 400 are heated excessively, the temperature control device can cool them, and when the secondary batteries 400 are cooled too much, the temperature control device can heat them. Thus, the performance of the power storage system 415 is not easily influenced by the outside air temperature.

In FIG. 14(C), the power storage system 415 is electrically connected to the control system 420 through a wiring 421 and a wiring 422. As the control system 420, the control system described in the above embodiment can be used. The wiring 421 is electrically connected to the positive electrodes of the plurality of the secondary batteries 400 through the conductive plate 413. The wiring 422 is electrically connected to the negative electrodes of the plurality of the secondary batteries 400 through the conductive plate 414.

[Secondary Battery Pack]

Next, examples of the power storage system of one embodiment of the present invention are described with reference to FIG. 15.

Figure 15A:
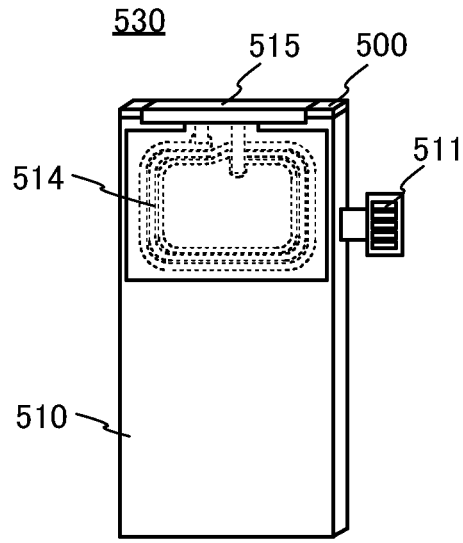
FIG. 15 Examples of structures of a storage battery.
Figure 15B:
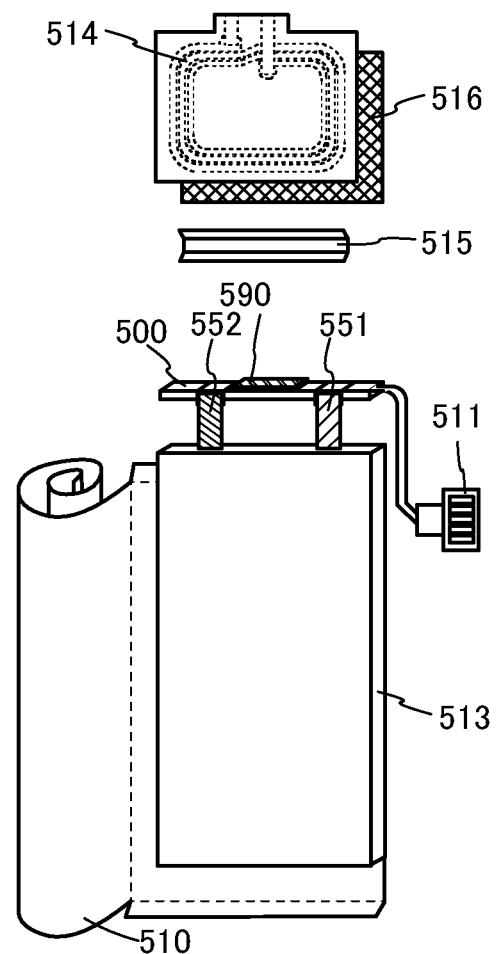

FIG. 15(A) is an external view of a secondary battery pack 530. FIG. 15(B) illustrates a structure of the secondary battery pack 530. The secondary battery pack 530 includes a circuit board 500 and a secondary battery 513. A label 510 is attached onto the secondary battery 513. The circuit board 500 is fixed by a sealant 515. The secondary battery pack 530 also includes an antenna 514.

The circuit board 500 includes a control system 590. As the control system 590, the control system described in the above embodiment can be used. For example, as illustrated in FIG. 15(B), the control system 590 is provided over the circuit board 500. The circuit board 500 is electrically connected to a terminal 511. The circuit board 500 is electrically connected to the antenna 514, one 551 of a positive electrode lead and a negative electrode lead of the secondary battery 513, and the other 552 of the positive electrode lead and the negative electrode lead.

Figure 15C:
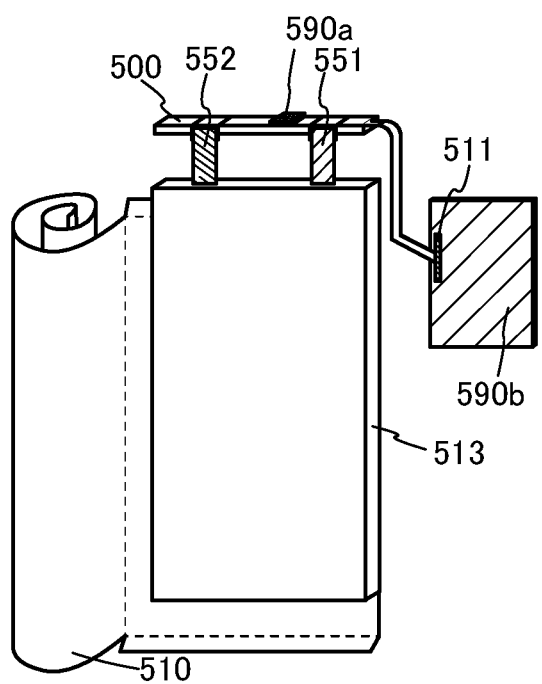

Alternatively, as illustrated in FIG. 15(C), a circuit system 590a provided over the circuit board 500 and a circuit system 590b electrically connected to the circuit board 500 through the terminal 511 may be included. For example, a part of the control system of one embodiment of the present invention is provided in the circuit system 590a, and another part is provided in the circuit system 590b. More specifically, for example, the protective circuit 137 described in the above embodiment is provided in the circuit system 590a, and the circuit 171, the circuit 172, the control circuit 134, and the memory 132 described in the above embodiment are provided in the circuit system 590b.

The shape of the antenna 514 is not limited to a coil shape and may be a linear shape or a plate shape. An antenna such as a planar antenna, an aperture antenna, a traveling-wave antenna, an EH antenna, a magnetic-field antenna, or a dielectric antenna may be used. Alternatively, the antenna 914 may be a flat-plate conductor. This flat-plate conductor can serve as one of conductors for electric field coupling. That is, the antenna 914 can serve as one of two conductors of a capacitor. Thus, electric power can be transmitted and received not only by an electromagnetic field or a magnetic field but also by an electric field.

The secondary battery pack 530 includes a layer 516 between the antenna 514 and the secondary battery 513. The layer 516 has a function of, for example, preventing an effect of the secondary battery 513 on an electromagnetic field. As the layer 516, for example, a magnetic body can be used.

The secondary battery 513 includes a wound battery element 593 as illustrated in FIG. 15(C). The battery element 593 includes a negative electrode 594, a positive electrode 595, and separators 596. The battery element 593 is obtained by winding a sheet of a stack in which the negative electrode 594 overlaps with the positive electrode 595 with the separator 596 provided therebetween.

This embodiment can be combined with the description of the other embodiments as appropriate.

Embodiment 5

In this embodiment, an example of a vehicle equipped with a power storage system which is one embodiment of the present invention is described. Examples of vehicles are automobiles, motorcycles, bicycles, and the like.

The use of power storage systems in vehicles enables production of next-generation clean energy vehicles such as hybrid electric vehicles (HEVs), electric vehicles (EVs), and plug-in hybrid electric vehicles (PHEVs).

Figure 16A:
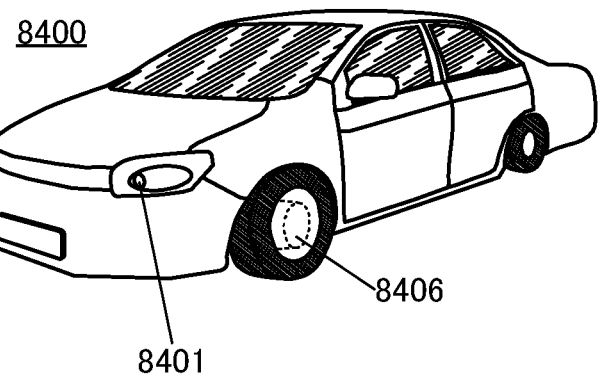
FIG. 16 Examples of vehicles.

FIG. 16 illustrates examples of vehicles using the power storage system which is one embodiment of the present invention. An automobile 8400 illustrated in FIG. 16(A) is an electric vehicle that runs on an electric motor as a power source. Alternatively, the automobile 8400 is a hybrid electric vehicle capable of driving appropriately using either an electric motor or an engine. The use of one embodiment of the present invention can achieve a high-mileage vehicle. The automobile 8400 includes a power storage system. The power storage system is used not only for driving an electric motor 8406, but also for supplying electric power to a light-emitting device such as a headlight 8401 or a room light (not illustrated).

The power storage system can also supply electric power to a display device of a speedometer, a tachometer, or the like included in the automobile 8400. Furthermore, the power storage system can supply electric power to a navigation system or the like included in the automobile 8400.

Figure 16B:
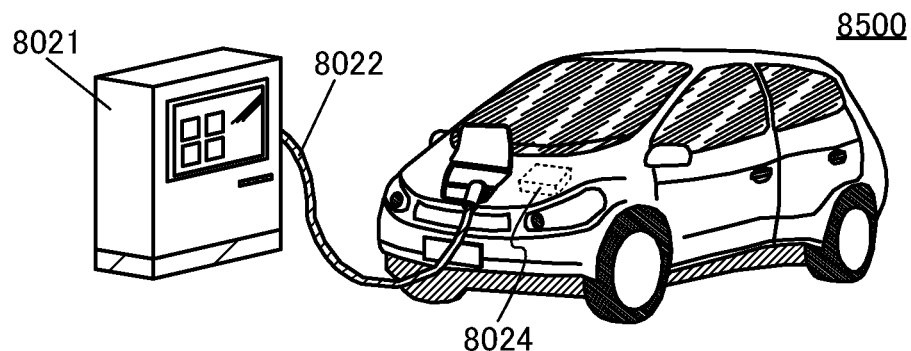

An automobile 8500 illustrated in FIG. 16(B) can be charged when the power storage system 8024 included in the automobile 8500 is supplied with electric power from external charging equipment by a plug-in system, a contactless power feeding system, or the like. FIG. 16(B) illustrates the state in which the power storage system 8024 included in the automobile 8500 is charged with a ground-based charging apparatus 8021 through a cable 8022. In charging, a given method such as CHAdeMO (registered trademark) or Combined Charging System may be employed as a charging method, the standard of a connector, or the like as appropriate. The charging apparatus 8021 may be a charging station provided in a commerce facility or a power source in a house. With the use of a plug-in technique, the power storage system 8024 included in the automobile 8500 can be charged by being supplied with electric power from the outside, for example. The charging can be performed by converting AC electric power into DC electric power through a converter, such as an AC-DC converter.

Although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the electric vehicle is stopped but also when driven. In addition, the contactless power feeding system may be utilized to perform transmission and reception of electric power between vehicles. A solar cell may be provided in the exterior of the automobile to charge the power storage system when the automobile stops or moves. To supply electric power in such a contactless manner, an electromagnetic induction method or a magnetic resonance method can be used.

Figure 16C:
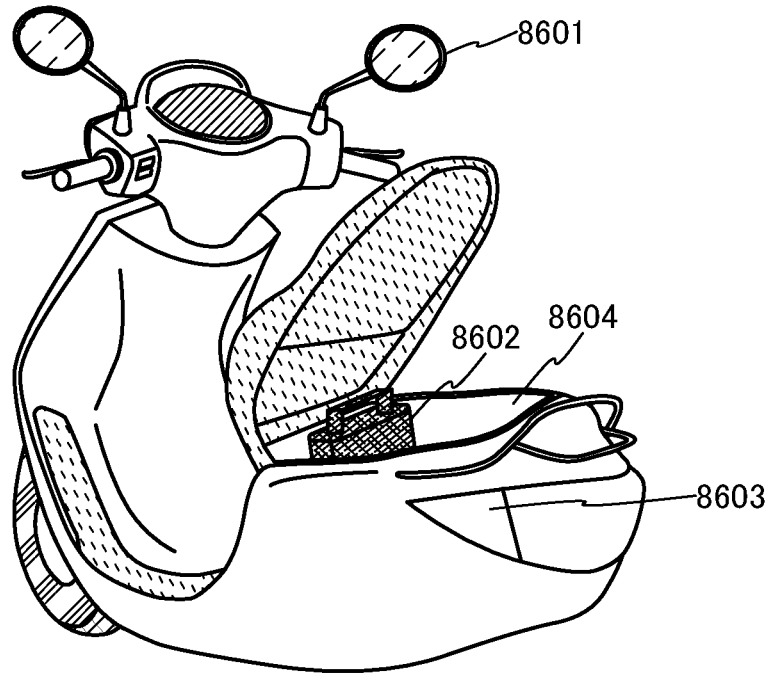

FIG. 16(C) is an example of a two-wheeled vehicle using the power storage system of one embodiment of the present invention. A motor scooter 8600 illustrated in FIG. 16(C) includes a power storage system 8602, side mirrors 8601, and indicator lights 8603. The power storage system 8602 can supply electricity to the indicator lights 8603.

In the motor scooter 8600 illustrated in FIG. 16(C), the power storage system 8602 can be stored in a storage unit wider seat 8604. The power storage system 8602 can be stored in the storage unit under seat 8604 even with a small size.

Figure 17A:
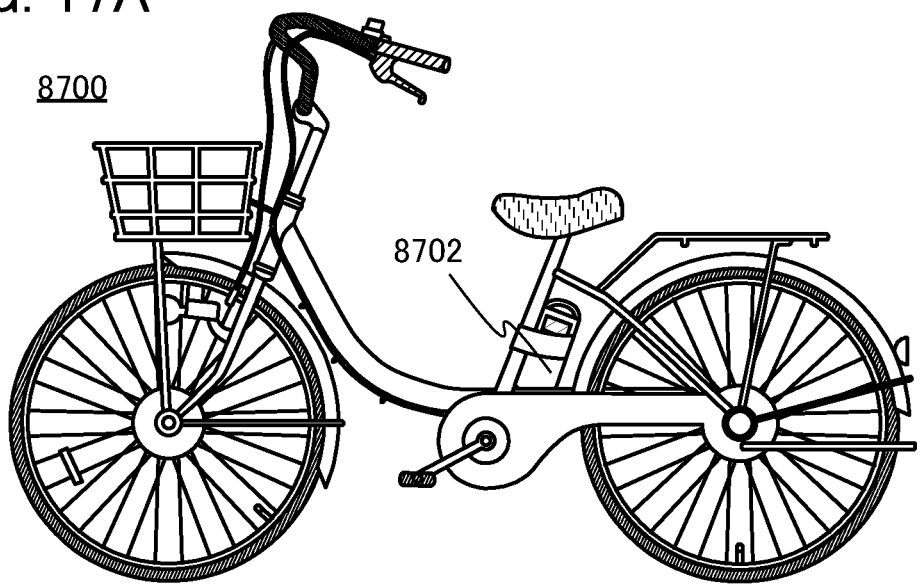
FIG. 17 An example of a vehicle.

FIG. 17(A) is an example of an electric bicycle using the power storage system of one embodiment of the present invention. The power storage system of one embodiment of the present invention can be used for an electric bicycle 8700 illustrated in FIG. 17(A). The power storage system of one embodiment of the present invention includes a plurality of storage batteries, a protective circuit, and a neural network, for example.

Figure 17B:
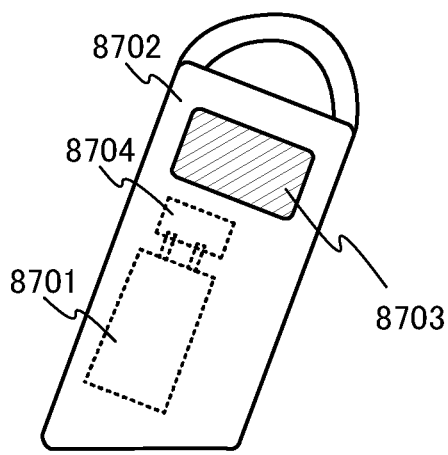

The electric bicycle 8700 includes a power storage system 8702. The power storage system 8702 can supply electricity to a motor that assists a rider. The power storage system 8702 is portable, and FIG. 17(B) illustrates the state where the power storage system 8702 is detached from the bicycle. A plurality of secondary batteries 8701 included in the power storage system of one embodiment of the present invention are incorporated in the power storage system 8702, and the remaining battery capacity and the like can be displayed on a display portion 8703. The power storage system 8702 also includes a control system 8704 of one embodiment of the present invention. The control system 8704 is electrically connected to a positive electrode and a negative electrode of the storage battery 8701. The control system described in the above embodiment can be used as the control system 8704.

The storage battery included in the power storage system which is mounted on the automobile 8400 illustrated in FIG. 16(A) is described in detail with reference to FIG. 18(A). The automobile 8400 preferably includes a plurality of secondary batteries. When an IC equipped with a lifetime estimation portion is mounted as a protective circuit of the secondary battery, neural network processing for controlling the secondary batteries can be performed. Even in the automobile 8400 using 1000 or more secondary batteries, the neural network processing for controlling the secondary batteries can be efficiently performed. As the secondary batteries, many small cylindrical secondary batteries are arranged to be used in a floor portion of the automobile. A battery pack in which a plurality of laminated secondary batteries are combined may be placed in the floor portion of the automobile. A roof portion of the automobile 8400 may include a photoelectric conversion element 8405. Light with which the photoelectric conversion element 8405 is irradiated can be photoelectrically converted and stored in the battery pack 8402. The automobile 8400 includes a sensor 8407. The sensor 8407 has a function of measuring the temperature of the air on the outside of the automobile 8400. The temperature of the air on the outside of the automobile 8400 may be referred to as an outside air temperature in this specification or the like. The sensor 8407 may be referred to as an outside air temperature sensor.

Figure 18A:
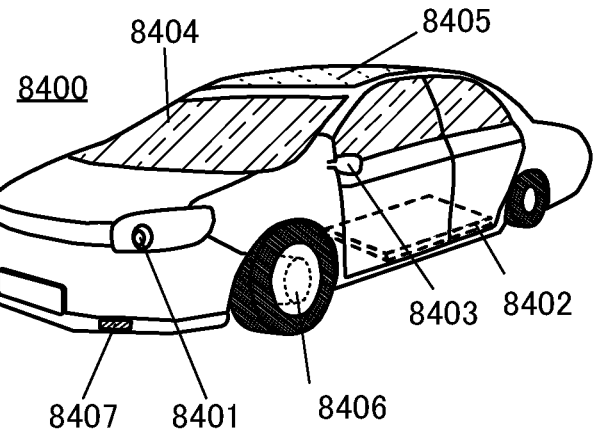
FIG. 18 An example of a vehicle.
Figure 18B:
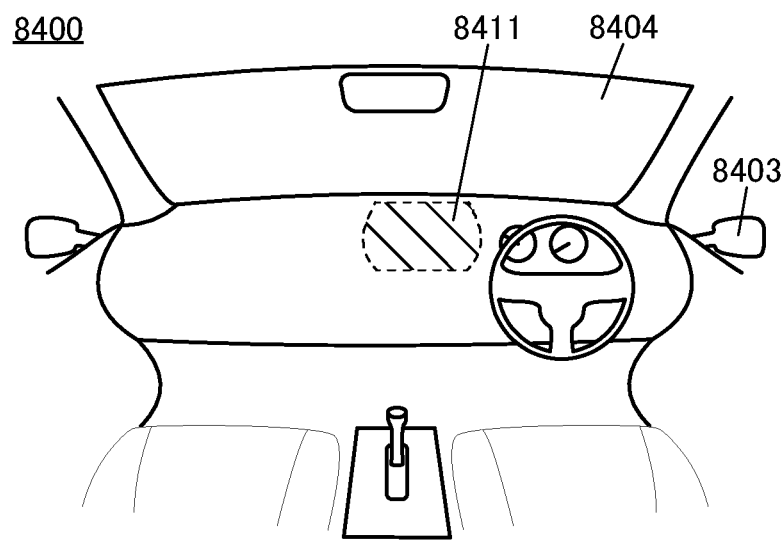

A navigation system can be mounted on the vehicles illustrated in FIG. 16, FIG. 17(A), and FIG. 18(A). The navigation system preferably includes the control system described in the above embodiment. FIG. 18(B) illustrates the interior of the automobile 8400. The navigation system includes a display portion 8411 and a microphone. The display portion 8411 preferably includes a touch sensor. A user of navigation can input information using an input to the touch sensor in the display portion 8411 and an audio input to the microphone. A windshield 8404 and a side mirror 8403 may each include a display portion. The navigation system 8411 is capable of displaying information on one or more of the display portion 8407, a display portion of the windshield 8404, and a display portion of the side mirror 8403.

Figure 18C:
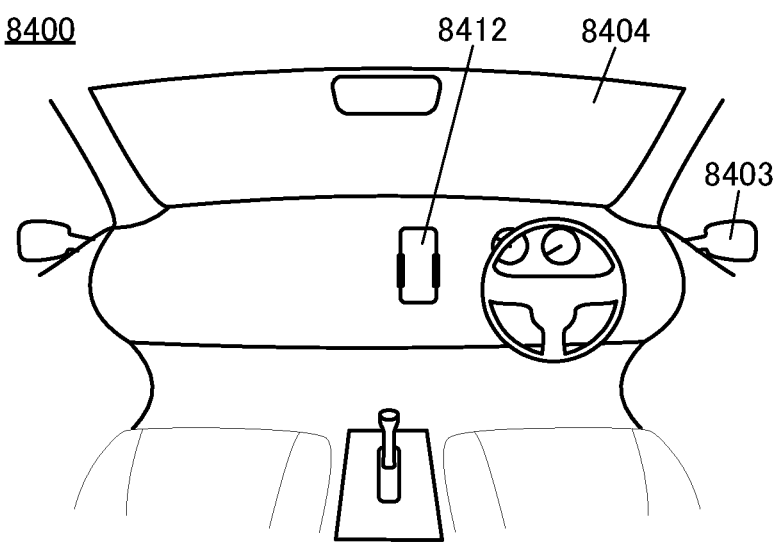
Figure 18D:
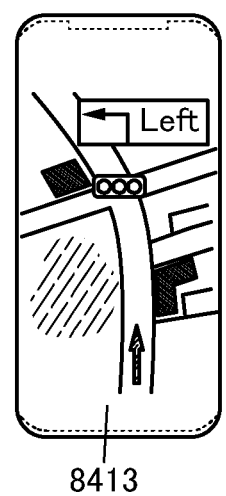

FIG. 18(C) shows an example in which a mobile phone 8412 is used as a navigation system. FIG. 18(D) shows an enlarged view of a display portion 8413 of the mobile phone 8412.

An operation example of a navigation system mounted on a vehicle is described with reference to FIG. 19.

Processing starts in Step S300.

In Step S301, a user of the navigation system inputs destination information to the navigation system.

In Step S302, the navigation system calculates the average value, the accumulated value, the maximum value, and the like of a discharging output to the destination. The remaining capacity (RC) and the impedance Z of the storage battery are acquired. It may take time to measure the impedance Z. In some cases, an external measurement apparatus is electrically connected in advance so that the impedance Z is measured. Thus, a value acquired in advance is preferably used as the impedance L For example, a value measured within a week, a value measured within a month, or a value measured within three months among measured values of the impedance Z are used.

In Step S303, the navigation system estimates a capacity C(x) available for discharging corresponding to a discharging output P(x), on the basis of the external temperature To, the remaining capacity (RC), and the impedance Z. For example, capacities C(1) to C(n) available for discharging corresponding to given discharging outputs P(1) to P(n) (here, n is an integer greater than or equal to 2) are estimated. Here, the discharging output P is not necessarily a constant value, and the value varies on the traveling route.

In Step S304, the navigation system estimates a possible traveling distance L(x) using the capacity C(x) available for discharging calculated in Step S303.

In Step S305, whether the vehicle can reach a charging spot after reaching the destination is estimated. Specifically, a charging spot is searched such that the length of a route thereto from the present location is shorter than L(x) and the destination is included on the route from the present location. If the charging spot (referred to as a charging spot E(a)) which meets the condition is found, the processing proceeds to Step S306. If the charging spot is not found, the processing proceeds to Step S311. Step S311 is a connector d connected to Step S312 shown in FIG. 20.

In Step S306, the navigation system starts guidance to the destination. Alternatively, the navigation system may start to control the running of the vehicle in order that the destination be reached.

In Step S309, the processing ends. Preferably, the vehicle stops at the charging spot E(a) to charge the storage battery after reaching the destination.

Figure 20:
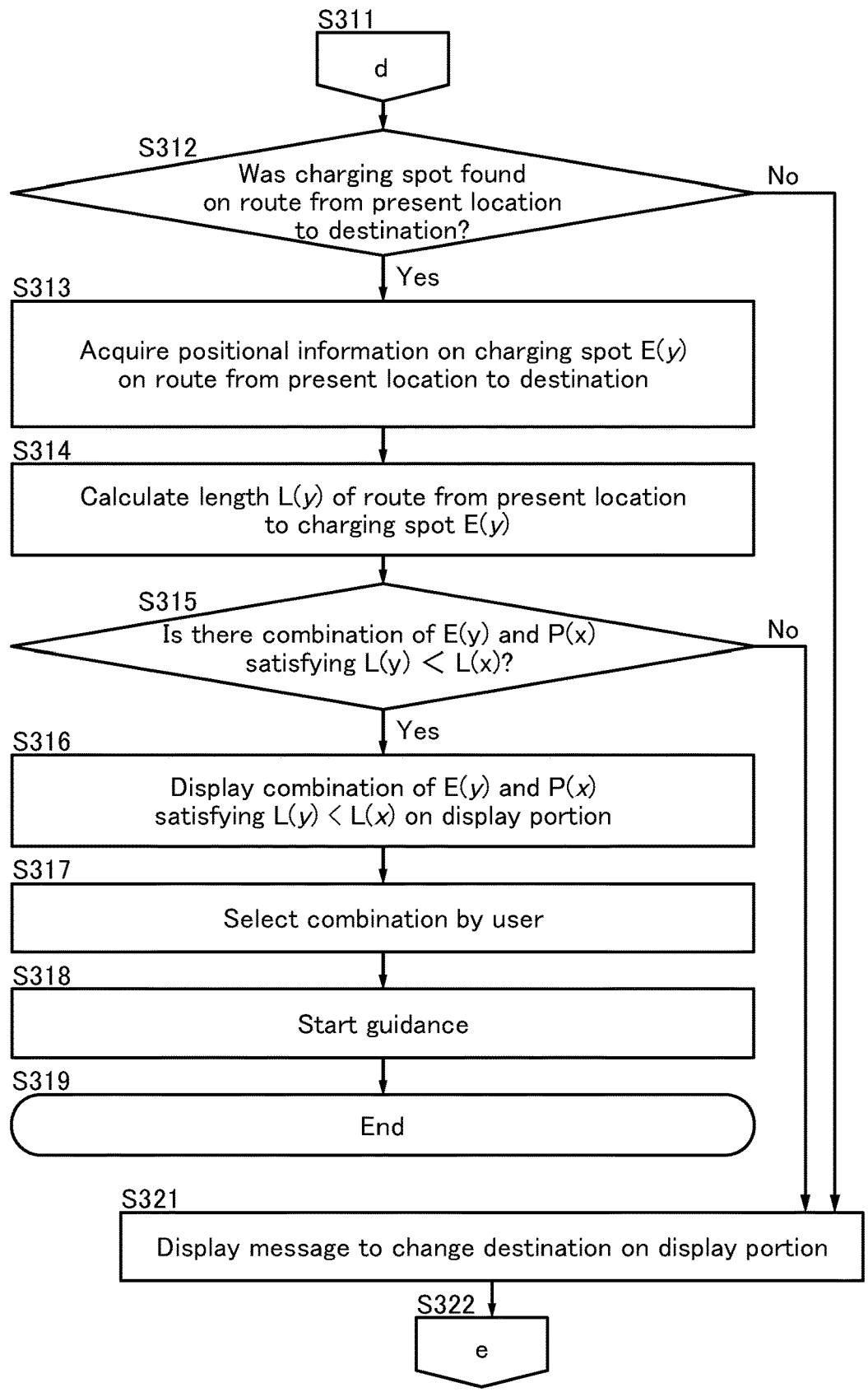
FIG. 20 A flow diagram showing an operation of a navigation system.

Next, an operation example of the navigation system mounted on the vehicle is described with reference to FIG. 20.

Figure 19:
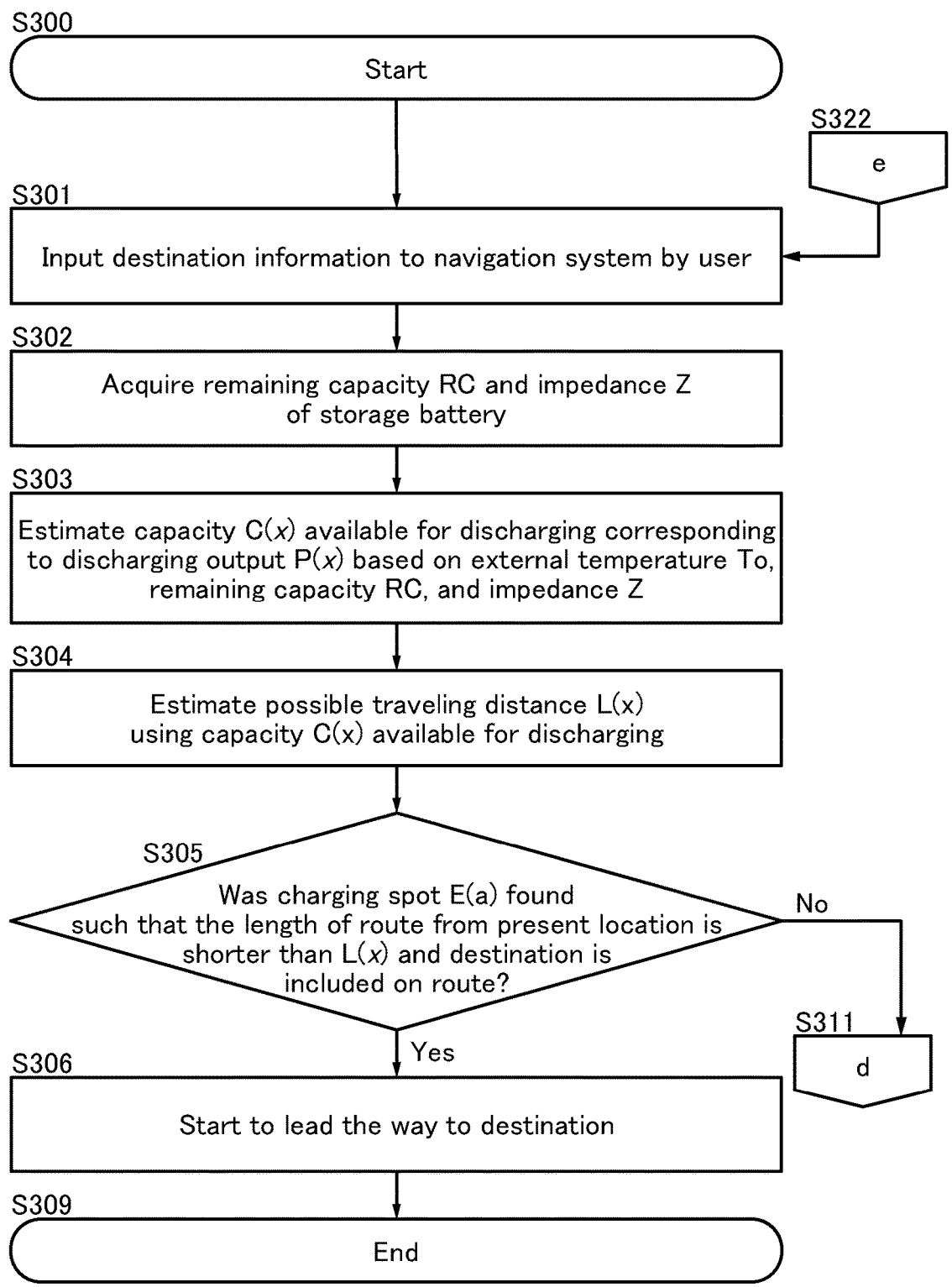
FIG. 19 A flow diagram showing an operation of a navigation system.

Step 311 is the connector d connected from Step S305 shown in FIG. 19 and the processing proceeds to Step S312.

In Step S312, the navigation system searches the charging spot located on the route from the present location to the destination. If the charging spot on the route is found, the processing proceeds to Step S313. If the charging spot is not found, the processing proceeds to Step S321.

In Step S313, the navigation system acquires positional information on each E(y) on the route from the present location to the destination. For example, positional information on charging spots E(1) to E(m) (m is an integer greater than or equal to 1) is acquired.

In Step S314, the length L(y) of the route from the present location to the charging spot E(y) is calculated.

In Step S315, if there is a combination of E(y) and P(x) which satisfies L(y)<L(x), the processing proceeds to Step S316, and if there is no such a combination, the processing proceeds to Step S21.

In Step S316, the navigation system displays the combination of E(y) and P(x) which satisfies L(y)<L(x). Here, the numerical value of P(x) may be displayed, or a name corresponding to P(x) may be given and the name may be displayed. For example, a name such as a "high-output mode" with a high output or a "power-saving mode" with a low output is displayed.

When the processing proceeds to Step S321, the navigation system displays a message requiring the user to change the destination on the display portion in Step S321. Next, the processing proceeds to Step S322. Step S322 is a connector e connected to Step S301 in FIG. 19, and the user selects again the destination in Step S301.

If there are a plurality of combinations of E(y) and P(x) in Step S317, the user selects one from the plurality of combinations of E(y) and P(x) displayed on the display portion.

In Step S318, the navigation system starts guidance on the basis of the combination of E(y) and P(x) selected in Step S313. Alternatively, the user may start to control the running of the vehicle in order that the destination be reached.

The processing ends in Step S319.

This embodiment can be combined with the description of the other embodiments as appropriate.

Embodiment 6

In this embodiment, an example in which the power storage system described in the above embodiments is mounted on an electronic device is described.

Figure 21A:
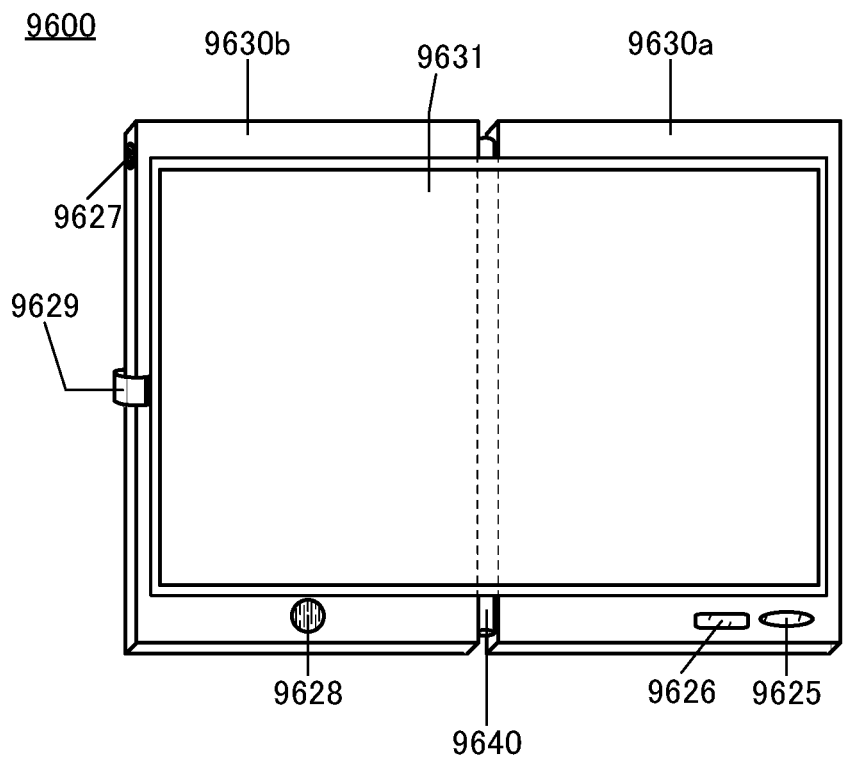
FIG. 21 An example of an electronic device.
Figure 21B:
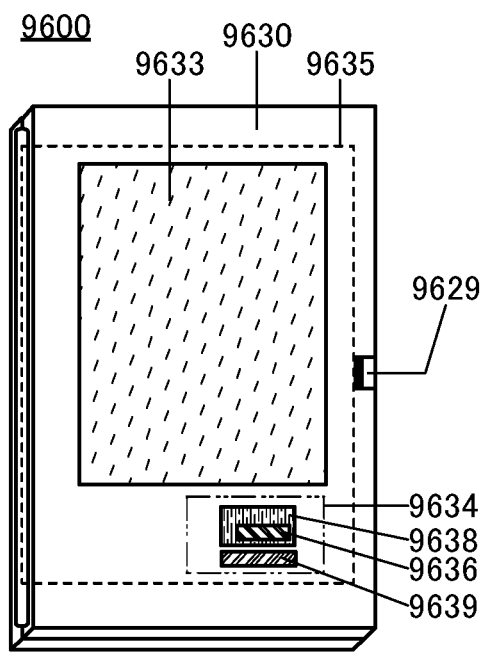

Next, FIG. 21(A) and FIG. 21(B) illustrate an example of a foldable tablet terminal. A tablet terminal 9600 illustrated in FIG. 21(A) and FIG. 21(B) includes a housing 9630a, a housing 9630b, a movable portion 9640 connecting the housing 9630a and the housing 9630b, a display portion 9631, a display mode changing switch 9626, a power switch 9627, a power saving mode changing switch 9625, a fastener 9629, and an operation switch 9628. A flexible panel is used for the display portion 9631, whereby a tablet terminal with a larger display portion can be provided. FIG. 21(A) illustrates the tablet terminal 9600 that is opened, and FIG. 21(B) illustrates the tablet terminal 9600 that is closed.

The tablet terminal 9600 includes a power storage unit 9635 inside the housing 9630a and the housing 9630b. The power storage unit 9635 is provided across the housing 9630a and the housing 9630b, passing through the movable portion 9640.

Part of the display portion 9631 can be a touch panel region and data can be input when a displayed operation key is touched. When a position where a keyboard display switching button is displayed on the touch panel is touched with a finger, a stylus, or the like, keyboard buttons can be displayed on the display portion 9631.

The display mode switch 9626 can switch the display between a portrait mode and a landscape mode, and between monochrome display and color display, for example. The power saving mode changing switch 9625 can control display luminance in accordance with the amount of external light in use, which is measured with an optical sensor incorporated in the tablet terminal 9600. Another detection device including a sensor for detecting inclination, such as a gyroscope sensor or an acceleration sensor, may be incorporated in the tablet terminal, in addition to the optical sensor.

FIG. 21(B) is a closed state and the tablet terminal includes the housing 9630, a solar cell 9633, and the power storage system of one embodiment of the present invention.

The power storage system includes a control system 9634 and the power storage unit 9635. The control system 9634 includes a protective circuit 9639 and a charging and discharging control circuit 9638 including a DC-DC converter 9636. The control system described in the above embodiment can be used as the control system 9634. The charging and discharging control circuit 9638 includes the control circuit 134 described in the above embodiment, for example.

The tablet terminal 9600 can be folded such that the housing 9630a and the housing 9630b overlap with each other when not in use. Thus, the display portion 9631 can be protected, which increases the durability of the tablet terminal 9600.

The tablet terminal illustrated in FIG. 21(A) and FIG. 21(B) can also have a function of displaying various kinds of information (a still image, a moving image, a text image, and the like), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on the surface of the tablet terminal, supplies electric power to a touch panel, a display portion, an image signal processor, and the like. Note that the solar cell 9633 can be provided on one or both surfaces of the housing 9630 and the power storage unit 9635 can be charged efficiently.

Figure 21C:
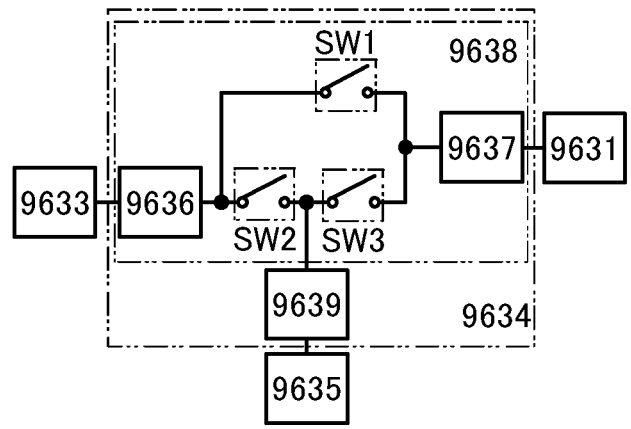

The structure and operation of the control system 9634 illustrated in FIG. 21(B) will be described with reference to a block diagram in FIG. 21(C). The solar cell 9633, the power storage unit 9635, the DC-DC converter 9636, a converter 9637, switches SW1 to SW3, and the display portion 9631 are illustrated in FIG. 21(C). The DC-DC converter 9636, the converter 9637, and the switches SW1 to SW3 correspond to the charging and discharging control circuit 9638 illustrated in FIG. 21(B). The charging and discharging control circuit 9638 and the protective circuit 9639 correspond to the control circuit 9634.

First, an example of the operation in the case where power is generated by the solar cell 9633 using external light is described. The voltage of electric power generated by the solar cell is raised or lowered by the DC-DC converter 9636 to a voltage for charging the power storage unit 9635. When the power from the solar cell 9633 is used for the operation of the display portion 9631, the switch SW1 is turned on and the voltage of the power is raised or lowered by the converter 9637 to a voltage needed for operating the display portion 9631. When display on the display portion 9631 is not performed, SW1 is turned off and SW2 is turned on, so that the power storage unit 9635 can be charged.

Note that the solar cell 9633 is described as an example of a power generation means; however, one embodiment of the present invention is not limited to this example. The power storage unit 9635 may be charged using another power generation means such as a piezoelectric element or a thermoelectric conversion element (Peltier element). For example, the power storage unit 9635 may be charged with a non-contact power transmission module that transmits and receives power wirelessly (without contact) to charge the battery or with a combination of other charging means.

Figure 22:
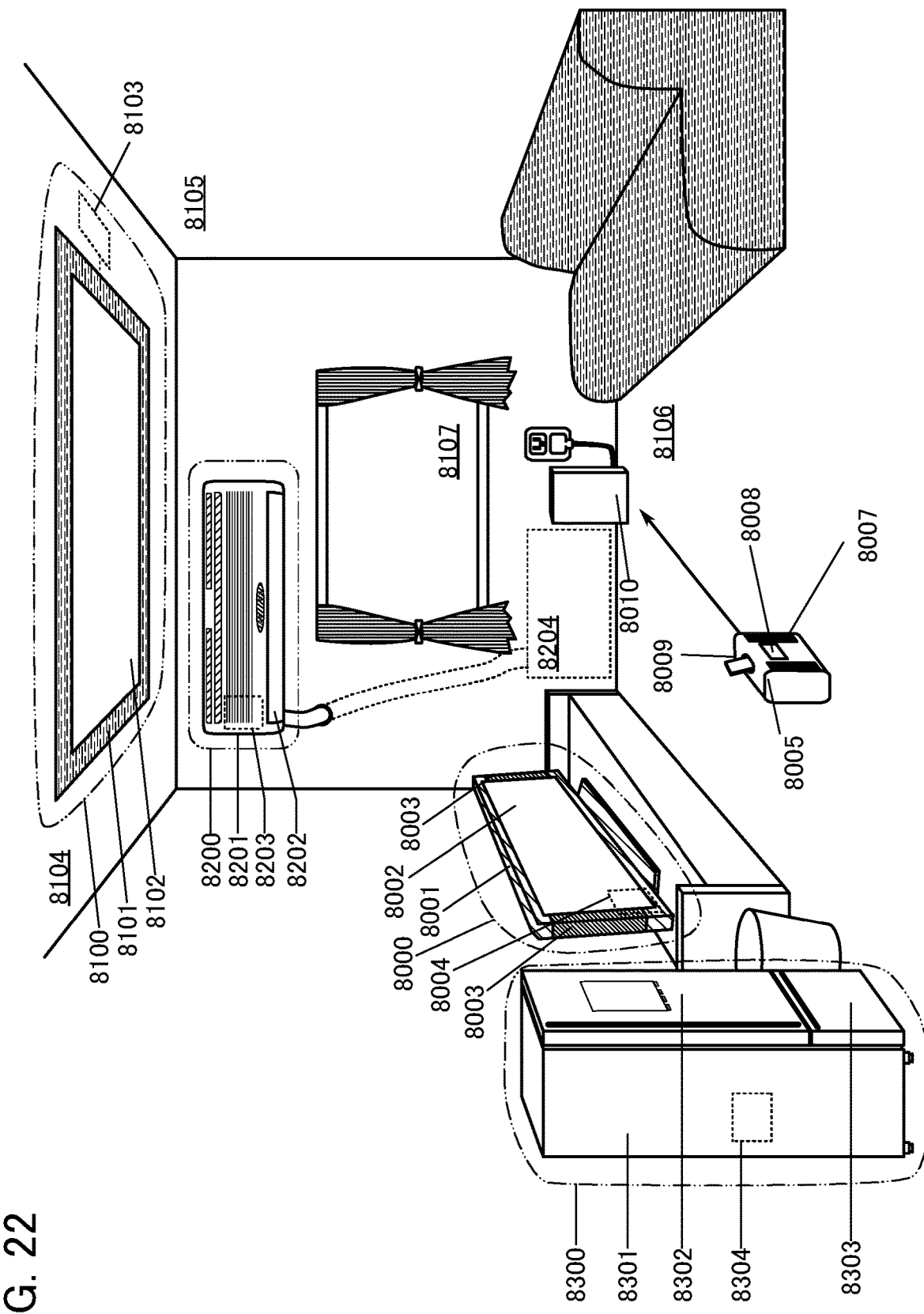
FIG. 22 Application examples of a power storage system.

FIG. 22 illustrates other examples of electronic devices. In FIG. 22, a display device 8000 is an example of an electronic device including the power storage system of one embodiment of the present invention. Specifically, the display device 8000 corresponds to a display device for TV broadcast reception and includes a housing 8001, a display portion 8002, speaker portions 8003, the secondary battery 8004, and the like. A detection system according to one embodiment of the present invention is provided in the housing 8001. The display device 8000 can receive electric power from a commercial power supply. Alternatively, the display device 8000 can use electric power stored in the secondary battery 8004.

A semiconductor display device such as a liquid crystal display device, a light-emitting device in which a light-emitting element such as an organic EL element is provided in each pixel, an electrophoretic display device, a digital micromirror device (MID), a plasma display panel (PDP), or a field emission display (FED) can be used for the display portion 8002.

An audio input device 8005 also uses a secondary battery. The audio input device 8005 includes the power storage system described in the above embodiments. The audio input device 8005 includes a plurality of sensors (an optical sensor, a temperature sensor, a humidity sensor, a pressure sensor, an illuminance sensor, a motion sensor, and the like) including a microphone, in addition to wireless communication elements. In accordance with an instruction spoken by a user, another device can be operated; for example, powering of the display device 8000 can be controlled, the amount of light of a lighting device 8100 can be controlled, or the like. The audio input device 8005 is capable of audio operation of a peripheral device and replaces a manual remote controller.

The audio input device 8005 includes a wheel or a mechanical transfer means and is configured to be capable of, while listening to an instruction precisely with the incorporated microphone by moving in the direction in which speaking by a user can be heard, displaying the content on a display portion 8008 or performing a touch input operation on the display portion 8008.

The audio input device 8005 can also function as a charging doc of a portable information terminal 8009 such as a smartphone. Electric power can be transmitted and received with a wire or wirelessly between the portable information terminal 8009 and the audio input device 8005. The portable information terminal 8009 is not particularly need to be carried indoors, and a load on the secondary battery and degradation thereof are desirably avoided while a necessary capacity is ensured. Thus, control or maintenance of the secondary battery or the like is desirably performed by the audio input device 8005. Since the audio input device 8005 includes the speaker 8007 and the microphone, hands-free conversation is possible even while the portable information terminal 8009 is charged. When the capacity of the secondary battery of the audio input device 8005 decreases, the audio input device 8005 moves in the direction indicated by the arrow and is charged by wireless charging from a charging module 8010 connected to an external power source.

The audio input device 8005 may be put on a stand. The audio input device 8005 may be provided with a wheel or a mechanical transfer means to move to a desired position. Alternatively, a stand or a wheel is not provided and the audio input device 8005 may be fixed to a desired position, for example, on the floor or the like.

Note that the display device includes, in its category, all of information display devices for personal computers, advertisement displays, and the like other than TV broadcast reception.

In FIG. 22, the tabletop lighting device 8100 is an example of an electronic device using a secondary battery 8103 which is controlled by a microprocessor controlling charging (including an APS). Specifically, the lighting device 8100 includes a housing 8101, a light source 8102, the secondary battery 8103, and the like. Although FIG. 22 illustrates the case where the secondary battery 8103 is provided in a roof 8104 on which the housing 8101 and the light source 8102 are installed, the secondary battery 8103 may be provided in the housing 8101. The lighting device 8100 can receive electric power from a commercial power supply. Alternatively, the lighting device 8100 can use electric power stored in the secondary battery 8103.

Note that although the tabletop lighting device 8100 provided on the roof 8104 is illustrated in FIG. 22 as an example, the secondary battery 8103 can be used as an installation lighting device provided in, for example, a sidewall 8105, a floor 8106, a window 8107, or the like other than the roof 8104. Alternatively, the secondary battery can be used in a tabletop lighting device or the like.

As the light source 8102, an artificial light source which emits light artificially by using power can be used. Specifically, an incandescent lamp, a discharge lamp such as a fluorescent lamp, and a light-emitting element such as an LED or an organic EL element are given as examples of the artificial light source.

In FIG. 22, an air conditioner including an indoor unit 8200 and an outdoor unit 8204 is an example of an electronic device using a secondary battery 8203. Specifically, the indoor unit 8200 includes a housing 8201, an air outlet 8202, the secondary battery 8203, and the like. Although FIG. 22 illustrates the case where the secondary battery 8203 is provided in the indoor unit 8200, the secondary battery 8203 may be provided in the outdoor unit 8204. Alternatively, the secondary batteries 8203 may be provided in both the indoor unit 8200 and the outdoor unit 8204. The air conditioner can receive electric power from a commercial power supply. Alternatively, the air conditioner can use electric power stored in the secondary battery 8203.

In FIG. 22, an electric refrigerator-freezer 8300 is an example of an electronic device using a secondary battery 8304. Specifically, the electric refrigerator-freezer 8300 includes a housing 8301, a door for refrigerator compartment 8302, a door for freezer compartment 8303, the secondary battery 8304, and the like. The secondary battery 8304 is provided in the housing 8301 in FIG. 22. The electric refrigerator-freezer 8300 can receive electric power from a commercial power supply. Alternatively, the electric refrigerator-freezer 8300 can use electric power stored in the secondary battery 8304.

In addition, in a time period when electronic devices are not used, particularly when the proportion of the amount of electric power which is actually used to the total amount of electric power which can be supplied from a commercial power source (such a proportion referred to as a usage rate of electric power) is low, electric power can be stored in the secondary battery, whereby an increase in the usage rate of electric power can be reduced in a time period when the electronic devices are used. For example, in the case of the electric refrigerator-freezer 8300, electric power can be stored in the secondary battery 8304 in night time when the temperature is low and the door for refrigerator compartment 8302 and the door for freezer compartment 8303 are not often opened and closed. On the other hand, in daytime when the temperature is high and the door for refrigerator compartment 8302 and the door for freezer compartment 8303 are frequently opened and closed, the secondary battery 8304 is used as an auxiliary power source; thus, the usage rate of electric power in daytime can be reduced.

A secondary battery can be provided in any electronic device other than the above-described electronic devices.

According to one embodiment of the present invention, the secondary battery can have excellent cycle characteristics. Thus, the microprocessor controlling charging (including an APS) of one embodiment of the present invention is mounted on the electronic device described in this embodiment, whereby an electronic device with a longer lifetime can be obtained. This embodiment can be implemented in appropriate combination with the other embodiments.

FIGS. 23(A) to 23(E) show examples of electronic devices including the power storage system of one embodiment of the present invention. Examples of electronic devices to which the power storage system of one embodiment of the present invention is applied are television sets (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, and large game machines such as pachinko machines, and the like.

Figure 23A:
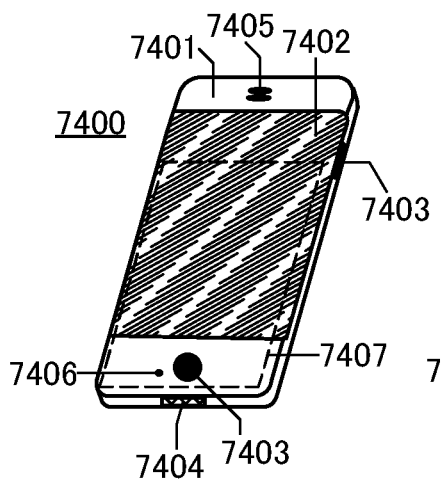
FIG. 23 Examples of electronic devices.

FIG. 23(A) shows an example of a mobile phone. A mobile phone 7400 is provided with an operation button 7403, an external connection port 7404, a speaker 7405, a microphone 7406, and the like in addition to a display portion 7402 incorporated in a housing 7401. The mobile phone 7400 includes the power storage system of one embodiment of the present invention. The power storage system of one embodiment of the present invention includes, for example, a storage battery 7407 and the control system described in the above embodiment. The control system preferably includes a protective circuit, a control circuit, a neural network, and the like, for example.

Figure 23B:
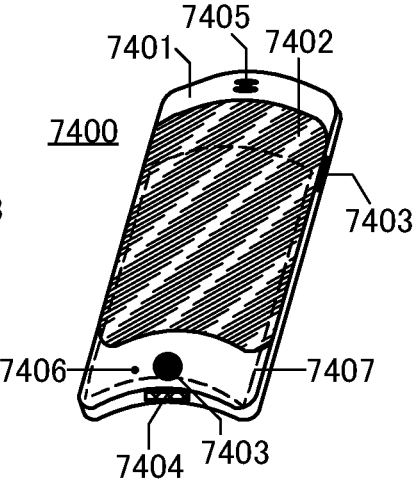
Figure 23C:
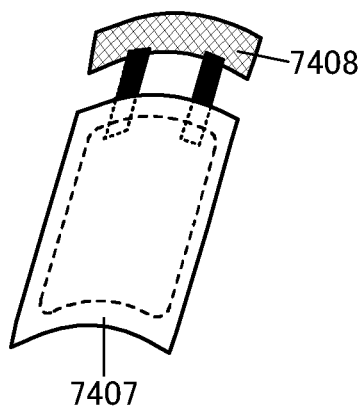

FIG. 23(B) illustrates the state where the mobile phone 7400 is curved. When the mobile phone 7400 is entirely curved by external force, the storage battery 7407 provided therein may also be curved. In such a case, a storage battery having flexibility is preferably used as the storage battery 7407. FIG. 23(C) illustrates the state where the storage battery having flexibility is curved. A control system 7408 is electrically connected to the storage battery. The control system described in the above embodiment can be used as the control system 7408.

A storage battery having a flexible shape can also be incorporated along a curved inside/outside wall surface of a house or a building or a curved interior/exterior surface of an automobile.

Figure 23D:
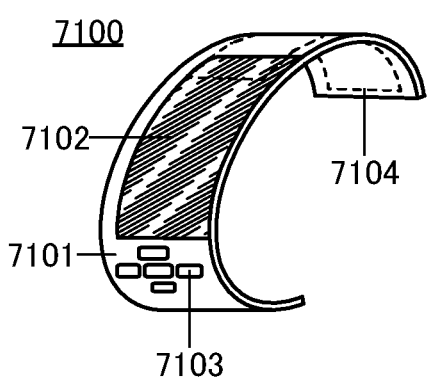

FIG. 23(D) shows an example of a bangle-type display device. A portable display device 7100 includes a housing 7101, a display portion 7102, an operation button 7103, and the power storage system of one embodiment of the present invention. The power storage system of one embodiment of the present invention includes, for example, a storage battery 7104 and the control system described in the above embodiment. The control system preferably includes a protective circuit, a control circuit, a neural network, and the like, for example.

Figure 23E:
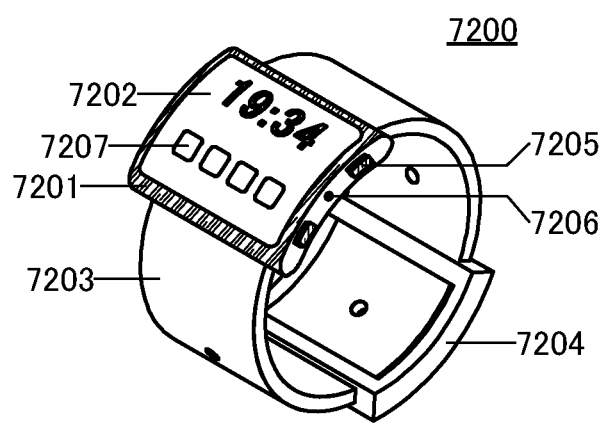

FIG. 23(E) shows an example of a watch-type portable information terminal. A portable information terminal 7200 includes a housing 7201, a display portion 7202, a band 7203, a buckle 7204, an operation button 7205, an input output terminal 7206, and the like.

The portable information terminal 7200 is capable of executing a variety of applications such as mobile phone calls, e-mailing, viewing and editing texts, music reproduction, Internet communication, and a computer game.

The display surface of the display portion 7202 is curved, and images can be displayed on the curved display surface.

The display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as time setting, power on/off, on/off of wireless communication, setting and cancellation of a silent mode, and setting and cancellation of a power saving mode can be performed. For example, the functions of the operation button 7205 can be set freely by setting the operation system incorporated in the portable information terminal 7200.

The portable information terminal 7200 can employ near field communication that is a communication method based on an existing communication standard. For example, mutual communication between the portable information terminal and a headset capable of wireless communication can be performed, and thus hands-free calling is possible.

The portable information terminal 7200 includes the input output terminal 7206, and data can be directly transmitted to and received from another information terminal via a connector. In addition, charging via the input output terminal 7206 is possible. The charging operation may be performed by wireless power feeding without using the input output terminal 7206.

The portable information terminal 7200 includes the power storage system of one embodiment of the present invention. The power storage system includes, for example, a storage battery and the control system described in the above embodiment. The control system preferably includes a protective circuit, a control circuit, a neural network, and the like, for example.

The portable information terminal 7200 preferably includes a sensor. As the sensor, for example, a human body sensor such as a fingerprint sensor, a pulse sensor, or a temperature sensor, a touch sensor, a pressure sensitive sensor, an acceleration sensor, or the like is preferably mounted.

This embodiment can be combined with the description of the other embodiments as appropriate.

REFERENCE NUMERALS

ACTV: circuit, BL: wiring, BLref: wiring, capacitor, C_h: capacitor, C_n: capacitor, C1: capacitor, C2: capacitor, CL: convolutional layer, CL[1]: wiring, CL[2]: wiring, CLD circuit, CM: current mirror circuit, CS: current source circuit, HL: hidden layer, HN: neuron circuit, HS: hidden synapse circuit, IF: wiring, IEref: wiring, IL: input layer, MAC: product-sum arithmetic circuit, NC: neuron circuit, OFST: circuit, OE: wiring, OL: output layer, ON: neuron circuit, OS: synapse circuit, R1: resistor, R_h: resistor, R_n: resistor, Ro: resistor, RST: wiring, RW: wiring, SC: synapse circuit, SW1: switch, SW2: switch, SW3: switch, Tr2: transistor, Tr11: transistor, Tr12: transistor, Tr21: transistor, Tr22: transistor, Tr23: transistor, VaL: wiring, VbL: wiring, VDDL: wiring, VrefL: wiring, VSSL wiring, VR: wiring, W_1: resistor, WD: WDref: wiring, WL: wiring, WDD: circuit, WLD: circuit, 130: power storage system, 131: control system, 131_j: control system, 132: memory, 134: control circuit, 135: storage battery. 135_1: storage battery, 135k: storage battery, 135n: storage battery, 136: battery group, 136_j: battery group, 137: protective circuit, 147: transistor, 148: transistor, 171: circuit, 172: circuit, 174: thermistor, 176: fuse, 400: secondary battery, 401: positive electrode cap, 402: battery can, 403: positive electrode terminal, 404: positive electrode, 406: negative electrode, 407: negative electrode terminal, 411: PTC element, 412: explosion-proof plate, 413: conductive plate, 414: conductive plate, 415: power storage system, 416: wire, 419: conductive plate, 420: control system, 421: wiring, 422: wiring, 423: wiring, 424: conductor, 425: insulator, 426: wiring, 500: circuit board, 510: label, 511: terminal, 512: semiconductor layer, 513: secondary battery, 514: antenna, 515: sealant, 516: layer, 530: secondary battery pack, 551: one, 552: the other, 590: control system, 590a: circuit system, 590b: circuit system, 593: battery element, 594: negative electrode. 595: positive electrode, 596: separator, 914: antenna, 7100: portable display device, 7101: housing, 7102: display portion, 7103: operation button, 7104: storage battery, 7200: portable information terminal, 7201: housing, 7202: display portion, 7203: band, 7204: buckle, 7205: operation button, 7206: input output terminal, 7207: icon, 7400: mobile phone, 7401: housing, 7402: display portion, 7403: operation button, 7404: external connection port, 7405: speaker, 7406: microphone, 7407: storage battery, 7408: control system, 8000: display device, 8001: housing, 8002: display portion, 8003: speaker portion, 8004: secondary battery, 8005: audio input device, 8006: stand, 8007: speaker, 8008: display portion, 8009: portable information terminal, 8010: charging module, 8021: charging apparatus, 8022: cable, 8024: power storage system, 8100: lighting device, 8101: housing, 8102: light source, 8103: secondary battery, 8104: roof, 8105: sidewall, 8106: floor, 8107: window, 8200: indoor unit, 8201: housing, 8202: air outlet, 8203: secondary battery, 8204: outdoor unit, 8300: electric refrigerator-freezer, 8301: housing, 8302: door for refrigerator compartment, 8303: door for freezer compartment, 8304: secondary battery, 8400: automobile, 8401: headlight, 8406: electric motor, 8500: automobile, 8600: motor scooter, 8601: side mirror, 8602: power storage system, 8603: indicator light, 8604: storage unit under seat, 8700: electric bicycle, 8701: storage battery, 8702: power storage system, 8703: display portion, 8704: control system, 9600: tablet terminal, 9625: switch, 9626: switch, 9627: power switch, 9628: operation switch, 9629: fastener, 9630: housing, 9630a: housing, 9630b: housing, 9631: display portion, 9633: solar cell, 9634: control system, 9635: power storage unit, 9636: DC-DC converter, 9637: converter, 9638: charging and discharging control circuit, 9639: protective circuit, 9640: movable portion

The invention claimed is:

1. A method of operating a power storage system comprising a storage battery, a first circuit, and a neural network,
wherein the first circuit has a function of measuring an impedance, and
wherein the neural network comprises an input layer, an output layer, and one or more hidden layers between the input layer and the output layer,
the method comprising:
a first step of stopping charging or discharging of the storage battery;
a second step of measuring an open circuit voltage of the storage battery;
a third step of measuring an impedance of the storage battery;
a fourth step of inputting the open circuit voltage and the impedance that are measured to the input layer;
a fifth step of outputting a first signal from the output layer;
a sixth step of changing a condition of charging or discharging of the storage battery in accordance with the first signal; and a seventh step of starting charging or discharging of the storage battery, wherein the first signal corresponds to an estimated value of a discharge capacity of the storage battery.

2. A method of operating a power storage system comprising a storage battery, a first circuit, and a neural network, wherein the first circuit has a function of measuring an impedance, and wherein the neural network comprises an input layer, an output layer, and one or more hidden layers between the input layer and the output layer, the method comprising:

a first step of measuring a full charge capacity of the storage battery;

a second step of charging the storage battery;

a third step of discharging the storage battery;

a fourth step of alternately repeating the second step and the third step; and a fifth step of measuring the full charge capacity of the storage battery, wherein the second step has a structure in which charging is stopped midway through a charging process and a remaining capacity, an open circuit voltage, and an impedance are calculated, wherein the full charge capacity measured in the first step is C1, wherein the full charge capacity measured in the fifth step is C2, wherein the remaining capacity, the open circuit voltage, and the impedance that are measured in the second step are input to the neural network, and wherein a second signal is output from the neural network when C2/C1 is greater than or equal to a first value and a third signal is output from the neural network when the C2/C1 is less than the first value.

3. The method of operating a power storage system according to claim 2, wherein the C2/C1 is greater than or equal to 0.7 and less than or equal to 0.95.

4. The method of operating a power storage system according to claim 1, wherein the neural network comprises a first transistor, a capacitor, and a second transistor, wherein one of a source and a drain of the first transistor is electrically connected to one electrode of the capacitor and a gate of the second transistor, wherein a channel formation region of the first transistor comprises a metal oxide, wherein the metal oxide comprises indium and an element M, wherein the element M is one or more selected from aluminum, gallium, tin, boron, silicon, titanium, iron, nickel, germanium, yttrium, zirconium, molybdenum, lanthanum, cerium, neodymium, hafnium, tantalum, and tungsten, and wherein a potential corresponding to analog data is retained in one of the source and the drain of the first transistor.

5. The method of operating a power storage system according to claim 4, wherein a channel region of the second transistor comprises silicon.

* * * * *